(12) United States Patent
Mahajan et al.

(10) Patent No.: US 10,971,468 B2
(45) Date of Patent: Apr. 6, 2021

(54) AUTOMATIC REGISTRATION BETWEEN CIRCUIT DIES AND INTERCONNECTS

(71) Applicant: 3M INNOVATIVE PROPERTIES COMPANY, St. Paul, MN (US)

(72) Inventors: Ankit Mahajan, Saint Paul, MN (US); Mikhail L. Pekurovsky, Bloomington, MN (US); Matthew S. Stay, Minneapolis, MN (US); Daniel J. Theis, Mahtomedi, MN (US); Ann M. Gilman, Woodbury, MN (US); Shawn C. Dodds, St. Paul, MN (US); Thomas J. Metzler, St. Paul, MN (US); Matthew R. D. Smith, Woodbury, MN (US); Roger W. Barton, Afton, MN (US); Joseph E. Hernandez, Port Huron, MI (US); Saagar A. Shah, Woodbury, MN (US); Kara A. Meyers, Oakdale, MN (US); James Zhu, Woodbury, MN (US); Teresa M. Goeddel, St. Paul, MN (US); Lyudmila A. Pekurovsky, Bloomington, MN (US); Jonathan W. Kemling, Woodbury, MN (US); Jeremy K. Larsen, Farmington, MN (US); Jessica Chiu, Woodbury, MN (US); Kayla C. Niccum, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/461,015

(22) PCT Filed: Nov. 16, 2017

(86) PCT No.: PCT/US2017/062030
§ 371 (c)(1),
(2) Date: May 15, 2019

(87) PCT Pub. No.: WO2018/094057
PCT Pub. Date: May 24, 2018

(65) Prior Publication Data
US 2019/0273061 A1 Sep. 5, 2019

Related U.S. Application Data

(60) Provisional application No. 62/424,686, filed on Nov. 21, 2016, provisional application No. 62/584,223, filed on Nov. 10, 2017.

(51) Int. Cl.
*H01L 23/00* (2006.01)
*H01L 23/498* (2006.01)
(Continued)

(52) U.S. Cl.
CPC ............. *H01L 24/24* (2013.01); *B81C 3/005* (2013.01); *H01L 23/49805* (2013.01);
(Continued)

(58) Field of Classification Search
CPC ...... B81C 3/005; B81C 2203/052–057; H01L 2224/82143; H01L 2224/80143;
(Continued)

(56) References Cited

U.S. PATENT DOCUMENTS

| 5,842,275 A * | 12/1998 | McMillan, II | H01L 24/81 29/840 |
| 6,902,260 B2 * | 6/2005 | Aschoff | B41J 2/16 347/63 |

(Continued)

FOREIGN PATENT DOCUMENTS

| JP | S52 149066 A | 12/1977 |
| JP | S63 24838 U | 2/1988 |

(Continued)

OTHER PUBLICATIONS

International Search Report for PCT International Application No. PCT/US2017/062030, dated Mar. 12, 2018, 3 pages.

*Primary Examiner* — Phat X Cao
*Assistant Examiner* — Diana C Vieira
(74) *Attorney, Agent, or Firm* — Yufeng Dong

(57) ABSTRACT

Processes for automatic registration between a solid circuit die and electrically conductive interconnects, and articles or
(Continued)

devices made by the same are provided. The solid circuit die is disposed on a substrate with contact pads aligned with channels on the substrate. Electrically conductive traces are formed by flowing a conductive liquid in the channels toward the contact pads to obtain the automatic registration.

26 Claims, 18 Drawing Sheets

(51) Int. Cl.
*B81C 3/00* (2006.01)
*H01L 23/544* (2006.01)

(52) U.S. Cl.
CPC ............ *H01L 23/544* (2013.01); *H01L 24/19* (2013.01); *H01L 24/26* (2013.01); *H01L 24/82* (2013.01); *H01L 2223/54426* (2013.01); *H01L 2224/24011* (2013.01); *H01L 2224/80143* (2013.01); *H01L 2224/82143* (2013.01); *H01L 2224/85143* (2013.01); *H01L 2224/95146* (2013.01)

(58) Field of Classification Search
CPC . H01L 2224/83143; H01L 2224/85143; H01L 2224/95146; H01L 2224/24225–24227; H01L 2224/81143; H01L 2224/84143; H01L 2224/86143; H01L 2224/87143; H01L 2224/88143; H01L 2224/89143; H01L 2224/958143; H01L 23/49; H01L 23/49861; H01L 23/49866; H01L 23/49883; H01L 2224/45139; H01L 2224/45239; H01L 2224/45147; H01L 2224/45247; H01L 24/24; H01L 24/82; H01L 23/5389; H01L 2224/18–255; H05K 1/0272; H05K 1/0296
See application file for complete search history.

(56) References Cited

U.S. PATENT DOCUMENTS

| | | | |
|---|---|---|---|
| 7,233,000 B2 | 6/2007 | Nassiopoulou | |
| 7,468,559 B2 | 12/2008 | Hall | |
| 8,482,137 B2* | 7/2013 | Yoshioka | H01L 24/24 |
| | | | 257/784 |
| 9,401,306 B2 | 7/2016 | Mahajan | |
| 9,522,450 B2* | 12/2016 | Berthier | H01L 25/50 |
| 10,327,325 B2* | 6/2019 | Edlinger | H05K 1/0206 |
| 2008/0258313 A1 | 10/2008 | Ali | |
| 2010/0155863 A1 | 6/2010 | Weekamp | |
| 2014/0284795 A1* | 9/2014 | Lee | H01L 23/13 |
| | | | 257/738 |
| 2015/0318237 A1* | 11/2015 | Narag | H01L 23/49838 |
| | | | 257/99 |
| 2015/0342037 A1 | 11/2015 | Guzek | |
| 2018/0190614 A1* | 7/2018 | Kumar | H01L 24/75 |

FOREIGN PATENT DOCUMENTS

| | | |
|---|---|---|
| JP | H11-17326 A | 1/1999 |
| JP | 2002-198638 A | 7/2002 |
| JP | 2005-515081 | 5/2005 |
| TW | 201 342 538 A | 10/2016 |

\* cited by examiner

AUTOMATIC REGISTRATION BETWEEN CIRCUIT DIES AND INTERCONNECTS

CROSS REFERENCE TO RELATED APPLICATIONS

This application is a national stage filing under 35 U.S.C. 371 of PCT/US2017/062030, filed Nov. 16, 2017, which claims the benefit of U.S. Application No. 62/424,686, filed Nov. 21, 2016, and U.S. Application No. 62/584,223, filed Nov. 10, 2017, the disclosure of which is incorporated by reference in its/their entirety herein.

TECHNICAL FIELD

The present disclosure relates to processes for automatic registration between circuit dies and electrically conductive interconnects, and articles or devices made by the same.

BACKGROUND

Integration of solid semiconductor dies with printing techniques combines the computational prowess of semiconductor technology with the high-throughputs and form-factor flexibility of web-based processes. However, a major hurdle in the flexible hybrid electronics manufacturing is the registration of semiconductor dies to printed traces on moving webs. Typical alignment mechanisms of wafer-based semiconductor devices may not be readily transferred to web-based processes.

SUMMARY

There is a desire to achieve micron-level registration between solid circuit dies and electrically conductive interconnects on a substrate, in particular, a moving, stretchy flexible substrate. Briefly, in one aspect, the present disclosure describes an article including a substrate having a major surface. A pocket and one or more channels are formed on the major surface. The channels each extend between a first end and a second end thereof. The first end is fluidly connected to the pocket. A solid circuit die is disposed in the pocket. The solid circuit die has one or more contact pads on a surface thereof aligned with the first ends of the channels. One or more electrically conductive traces are formed in the one or more channels. The electrically conductive traces extend to the first ends of the channels and in direct contact with the contact pads of the solid circuit die.

In another aspect, the present disclosure describes a method including providing a substrate having a major surface, and forming a pocket and one or more channels on the major surface of the substrate. The channels each extend between a first end and a second end thereof. The first end is fluidly connected to the pocket. The method further includes disposing a solid circuit die in the pocket. The solid circuit die has one or more contact pads on a surface thereof aligned with the first ends of the channels. The method further includes disposing a conductive liquid at the second ends of the channels, flowing the conductive liquid, primarily by a capillary pressure, in the channels toward the first ends to make direct contact with the contact pads of the solid circuit die, and solidifying the conductive liquid to form electrically conductive traces in direct contact with the contact pads of the solid circuit die.

In another aspect, the present disclosure describes a method of providing an electronic component having one or more contacts with interconnection. The method includes providing a substrate having a registration feature shaped to receive the electronic component, and at least one channel shaped to extend away an area that corresponds with one of the contacts when the electronic component is disposed within the registration feature; disposing the electronic component within the registration feature; dispensing a conductive liquid within the channel such that the conductive liquid flows by capillary in the channel toward and wets the contacts; and solidifying the conductive liquid to form a conductive trace in the channel.

Various unexpected results and advantages are obtained in exemplary embodiments of the disclosure. One such advantage of exemplary embodiments of the present disclosure is that automatic registration can be obtained between a solid circuit die and electrically conductive interconnects or traces. In particular, when the solid circuit die is disposed on a flexible substrate that may be stretched along various directions, it might be challenging to provide interconnects aligned or registered with contact pads of the circuit die attached to such moving, stretchy substrate. The present disclosure provides methods of automatic registration via a capillary liquid flow to overcome the challenge. The automatic registration described herein can be tolerant of various sources of misalignment in web-based processes such as, for example, a substrate distortion from in-line thermal cycles and/or tension control.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
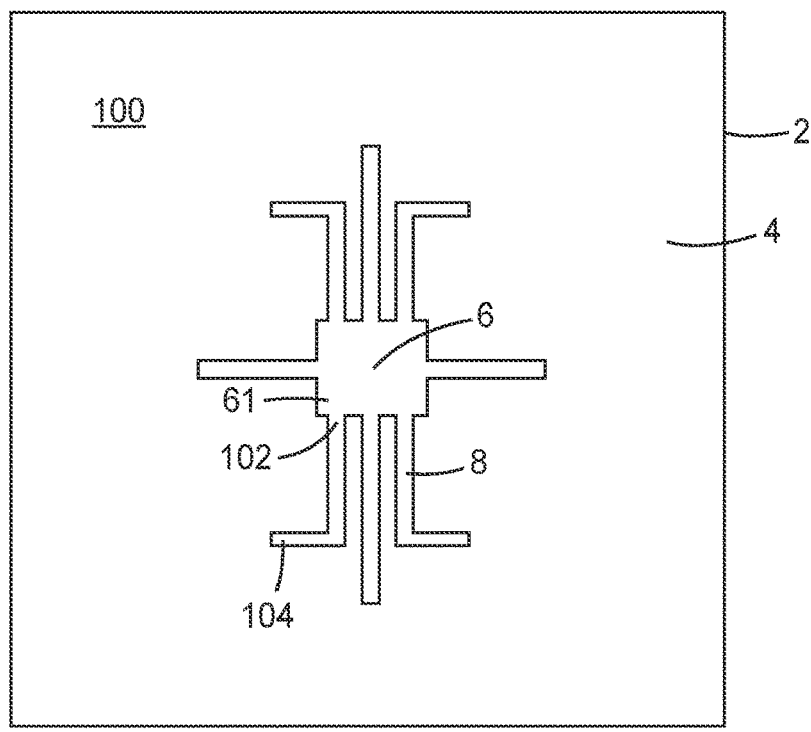
FIG. 1 is a top view of a substrate including multiple channels connected to a pocket, according to one embodiment of the present disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The term "conductive liquid" refers to a liquid composition that is flowable in a channel via capillary. The conductive liquid described herein can be solidified to form electrically conductive traces. The conductive liquid may include any suitable electronic material having properties desired for use in forming electrically conductive traces.

The term "adhesive ink" refers to a liquid composition including a liquid carrier and one or more adhesives. The adhesive ink described herein can be solidified to form an adhesive layer.

The term "adjoining" with reference to a particular layer means joined with or attached to another layer, in a position wherein the two layers are either next to (i.e., adjacent to) and directly contacting each other, or contiguous with each other but not in direct contact (i.e., there are one or more additional layers intervening between the layers).

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

FIG. 1 illustrates a top view of an article 100. The article 100 includes a substrate 2. The substrate 2 has a structured major surface 4. In some embodiments, the substrate 2 can be a flexible substrate, for example, a web of indefinite length polymeric material. The flexible substrate or web may be stretched (e.g., along a machine direction and/or a cross direction) when moving along a web path. One or more pockets 6 and one or more channels 8 are formed on the major surface 4. The channels 8 each extend between a first end 102 and a second end 104. The first ends 102 of the channels 8 are connected to the respective edges 61 of the pocket 6 such that the channels 8 and the pocket 6 are in fluid communication. The channels 8 are configured to allow fluid to flow primarily via a capillary force, for example, from the second end 104 toward the first end 102. In some embodiments, at least one of the channels 8 or at least a portion of one channel may be open on the upper surface. In some embodiments, at least one of the channels 8 or at least a portion of one channel may be enclosed by an upper wall. While one pocket and eight channels are shown in the embodiment of FIG. 1, it is to be understood that any other numbers of pockets and/or channels can be formed on the substrate. The channels and the pockets can be fluidly connected in various configurations.

In some embodiments, the features (e.g., the channels 8 or the pocket 6) on the substrate 2 can include indentations formed into the major surface 4 thereof. In some embodiments, the features (e.g., the channels 8 or the pocket 6) on the substrate 2 can include embossments projecting from the major surface 4 thereof. In some embodiments, the features (e.g., the channels 8 or the pocket 6) can be formed by adding materials on the major surface 4. The features (e.g., the channels and the pocket) can be formed by any suitable techniques including, for example, microreplication, hot embossing, molding, soft lithography, etching, 3D printing, etc.

In some embodiments, the features (e.g., the channels 8 or the pocket 6) may have substantially the same depth. The top or bottom surfaces of the adjacent features on the substrate 2 may be coplanar. In some embodiments, the features may have different depths. The top or bottom surfaces of the adjacent features may not be coplanar. For example, one or more steps may be formed at an edge where a channel is connected to a pocket.

In some embodiments, the substrate 2 may be a flexible substrate, for example, a web of indefinite length material being conveyed through a web path. The flexible substrate may include, for example, polyethylene terephthalate (PET), polyethylene, polystyrene, polyurethane etc. The processes described herein can be carried out on a roll-to-roll apparatus including one or more rollers to convey the web along the web path. It is to be understood in some embodiments, the substrate 2 or a portion of the substrate 2 may be rigid, made of materials include, for example, bakelite, acrylonitrile butadiene styrene (ABS), cured epoxy systems, etc. The substrate 2 can be made of any suitable materials for forming the features.

The substrate 2 may have a thickness of, for example, 2 mm or less, 1 mm or less, 500 microns or less, or 200 microns or less. The features (e.g., the channels and the pocket) formed on the major surface 4 may have a minimum dimension of, for example, 500 microns or less, 300 microns or less, 100 microns or less, 50 microns or less, or 10 microns or less.

Figure 3:
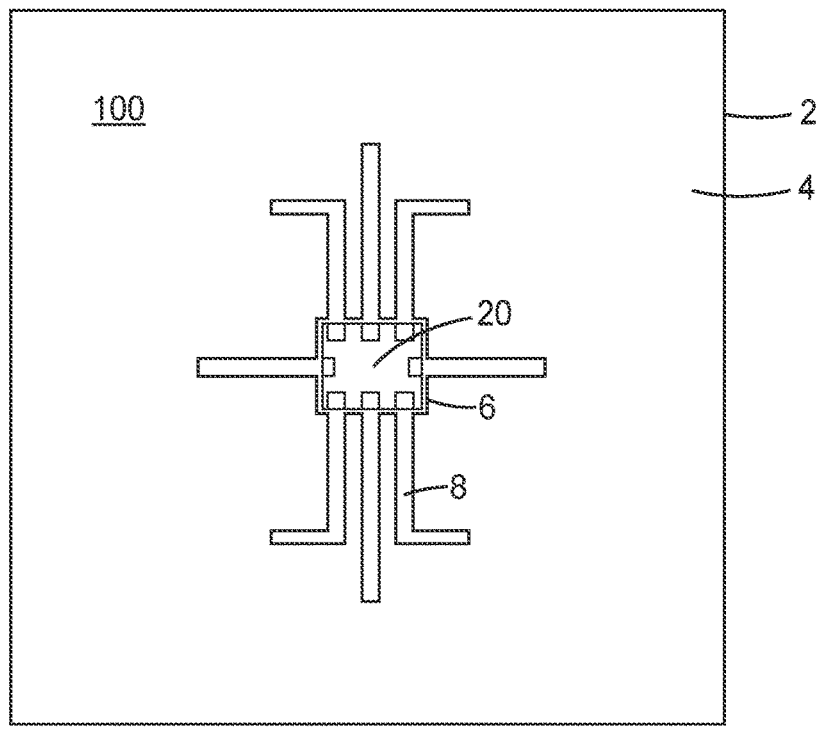
FIG. 3 is a top view of the substrate of FIG. 2 where a circuit die is disposed in the pocket thereof, according to one embodiment of the present disclosure.
Figure 5A:
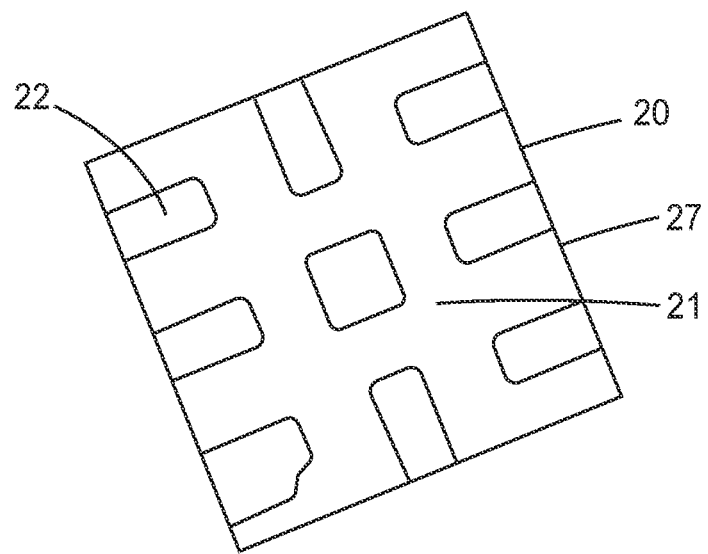
FIG. 5A is a top view of a circuit die, according to one embodiment of the present disclosure.
Figure 5B:
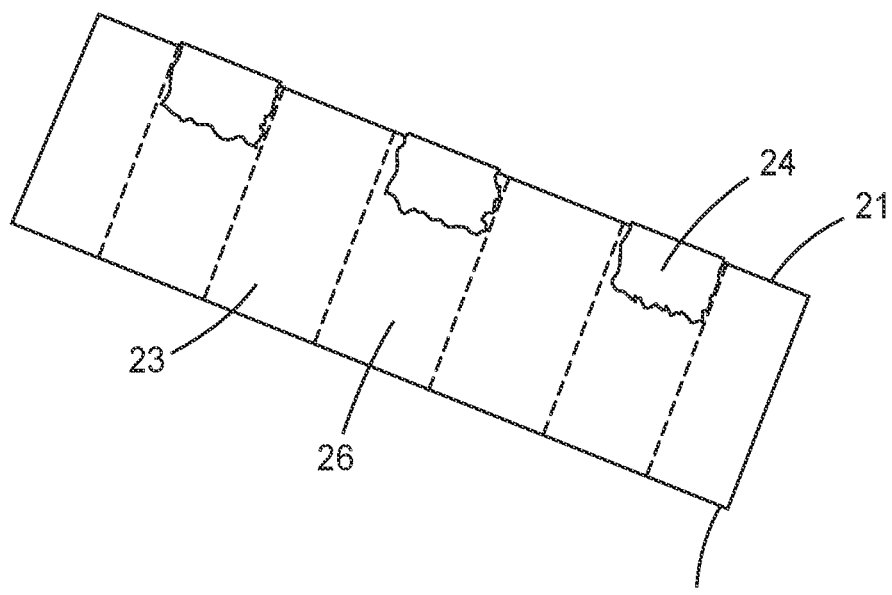
FIG. 5B is a side view of the circuit die of FIG. 5A.

The pocket 6 is configured to receive a solid circuit die 20 as shown in FIG. 3. FIGS. 5A-B illustrate a top view and a side view of the circuit die 20, respectively. The circuit die 20 includes one or more contact pads 22 disposed on a major surface 21 thereof. At least some of the contact pads 22 are disposed along the edges 27 of the circuit die 20. In the depicted embodiment of FIG. 5B, the contact pads 22 have the respective side portions 24 disposed on side surfaces 23 of the circuit die 20. In some embodiments, the contact pads may be partially embedded in the circuit die 20 and have an exposed surface or portion adjacent to the edges 27 of the circuit die 20. The contact pads of the circuit die 20 may be made of any suitable electrically conductive materials such as, for example, metals. It is to be understood that the contact pads may vary with the specific types of circuit dies. Some contact pads may include legs sticking out of a casing of the circuit die. Some contact pads may include electroplated metals (e.g., Cu/Au) on the surface of the circuit die casing. In some embodiments, contact pads may include metal bumps directly on the bare die surface.

When the circuit die 20 is disposed inside the pocket 6, the contact pads 22 at the edges 27 of the circuit die 20 may be aligned with respect to the respective channels 8 such that fluid flows in the channels can be automatically directed, primarily via a capillary force, to the corresponding contact pads. In some embodiments, a contact pad and a channel can be aligned such that the contact pad may have an exposed surface or portion that directly faces the second end of a channel. For example, FIG. 5B shows one or more portions 26 of the side surface 23 and the side contact pad portions 24 formed thereon that may directly face the respective channels 8 after the circuit die 20 is installed in the pocket 6. In other embodiments, a contact pad may not directly face a channel. The contact pad and the channel can be aligned such that a fluid path (e.g., a gap between the side walls of the pocket and the circuit die such as the gap 38 shown in FIG. 4B) can fluidly connect the channel to the corresponding contact pad. Fluid can flow in the channel through the fluid path toward the contact pad and directly connect to that contact pad. It is to be understood that the contact pads and the channels may not have a one-to-one correspondence. The contact pads and the channels can be aligned such that fluid flows in one or more channels may be directed to one or more predetermined contact pads.

In some embodiments, the contact pads 22 may have a width that substantially matches the width of the channels 8. In some embodiments, the channels may have a width greater than that of the contact pads aligned with the channels. The channel may have a width, for example, about 10%, about 30%, about 50%, about 70%, or about 90% greater than the width of the contact pad on the circuit die. For example, when the contact pad is 200 microns wide, the channel is chosen to be 300 microns wide. A wider channel may allow an electrically conductive trace formed therein to substantially cover the contact pad and provide superior electrical contacts therebetween.

The circuit die 20 can include a circuit chip having one or more contact pads arranged along the edges 27 thereof. In some embodiments, the circuit die 20 can include a rigid semiconductor die. In some embodiments, the circuit die 20 can include a printed circuit board (PCB). In some embodiments, the circuit die 20 can include a flexible printed circuit (FPC). It is to be understood that the circuit die 20 can be any suitable circuit dies to be disposed on a substrate, of which one or more contact pads are to be registered and connected to electrically conductive traces on the substrate.

In some embodiments, the circuit die 20 may have a thickness substantially the same as the depth of pocket 6 or the depth of the channel 8. In some embodiments, the depth of the pocket may be such that the bottom of the solid circuit die within the pocket is positioned approximately at the neutral bending plane of the neutral construction.

In some embodiments, the circuit die 20 may be an ultra-thin chip with a thickness of, for example, about 2 microns to about 200 microns, about 5 microns to about 100 microns, or about 10 microns to about 100 microns. The depth of the pocket can be, for example, 2 times, 4 times, 6 times, 8 times, or 10 times greater than the thickness of circuit die. The depth of the pocket may be such that when the solid circuit die is attached to the bottom surface of the pocket, the solid circuit die may extend substantially along the neutral bending plane of the neutral construction. This arrangement may effectively reduce strain on the solid circuit die when the substrate bends.

In some embodiments, the ultra-thin circuit die may be loaded on a handle substrate to facilitate the disposition into the pocket 6. The handle substrate can be removed after the circuit die 20 is received by the pocket 6.

Figure 2:
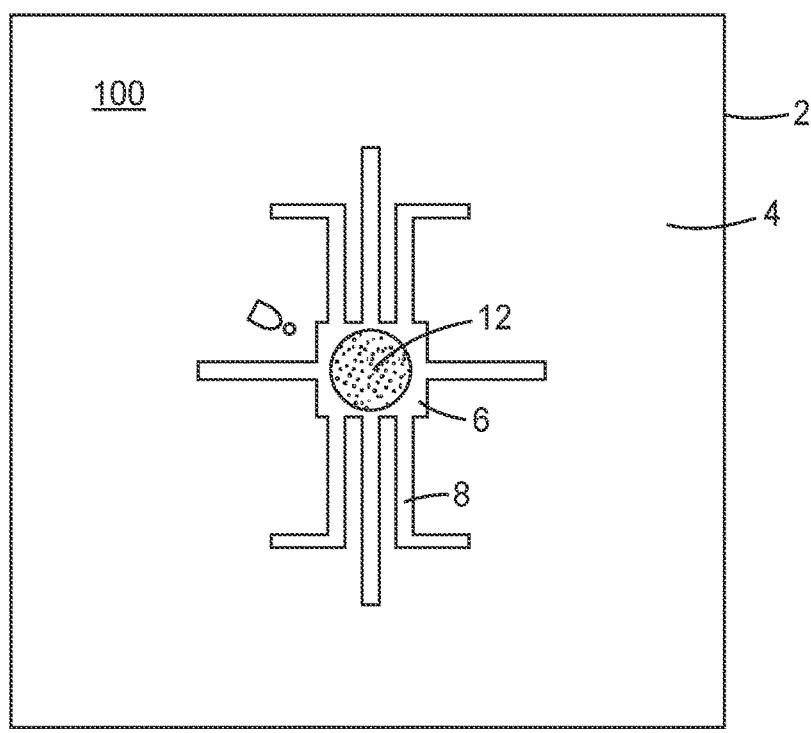
FIG. 2 is a top view of the substrate of FIG. 1 where an adhesive is applied to the pocket, according to one embodiment of the present disclosure.
Figure 6A:
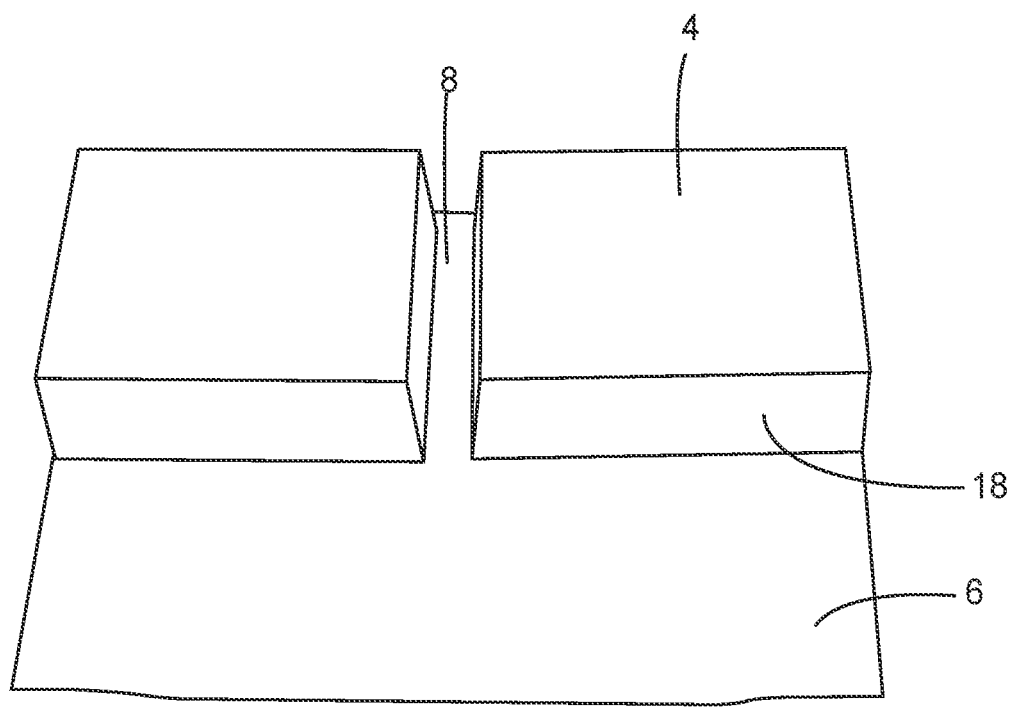
FIG. 6A is a side perspective view of a portion of the substrate of FIG. 1.

In some embodiments, the circuit die 20 can be attached to the bottom surface of the pocket 6 via an adhesive 12 as shown in FIG. 2. Exemplary adhesives may include structural adhesives, acrylic adhesives, epoxy adhesive, urethane adhesives, optical adhesives, etc. In some embodiments, the adhering can be performed with, for example, a UV curable polyurethane compound. The adhesive 12 can be precisely applied to attach the circuit die 20 onto the bottom surface of the pocket 6 without blocking the channels 8. See also FIG. 6A.

Figure 4A:
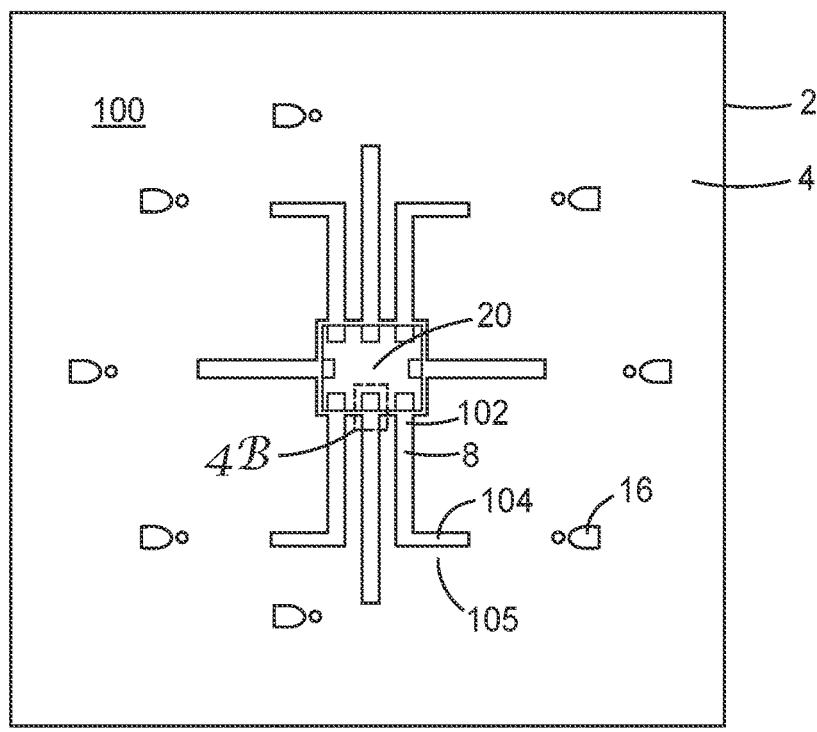
FIG. 4A is a top view of the substrate of FIG. 3 where a conductive liquid is disposed into the channels to form electrically conductive traces, according to one embodiment of the present disclosure.

Referring to FIGS. 3 and 4A, when the circuit die 20 is disposed inside the pocket 6, a conductive liquid 16 can be dispensed into the one or more channels 8. The conductive liquid 16 can be a liquid composition that is flowable in the channels 8 primarily by a capillary force. The conductive liquid 16 may include, for example, a liquid carrier and one or more electronic material, a liquid metal or metal alloy, etc. The conductive liquid described herein can be solidified to leave a continuous layer of electrically conductive material that forms an electrically conductive trace in the channel. Suitable liquid compositions may include, for example, silver ink, silver nanoparticle ink, reactive silver ink, copper ink, conductive polymer inks, liquid metals or alloys (e.g., metals or alloys that melt at low temperatures and solidify at room temperatures), etc.

The conductive liquid 16 can be delivered at the second, distal ends 104 of the channels 8 by various methods including, for example, ink jet printing, dispensing, micro-injection, etc. In some embodiments, one or more reservoirs can be provided to be adjacent and in fluid communication with the second end 104 of the channel 8. The reservoirs can be shaped to provide a convenient receptacle for the dispensed conductive liquid. The conductive liquid 16 can be disposed into the reservoirs by, for example, ink jet printing, dispensing such as piezo dispensing, needle dispensing, screen printing, flexo printing, etc. The conductive liquid 16 can move, by virtue of a capillary pressure, from the reservoirs to the channels 8. The reservoir may have a depth that is substantially the same as the depth of the channels 8. The reservoir can have any desirable shapes and dimensions that are suitable for receiving the conductive liquid 16. In some embodiments, the reservoir may have a diametric dimension in a range, for example, from about 1 micron to about 1.0 mm, from about 5 microns to about 500 microns, or from about 50 micron to about 500 microns.

In some embodiments, the conductive liquid 16 can be directly disposed on the surface area 105 around the second end 104 of the channel 8. Then the conductive liquid 16 can be automatically collected, via a capillary pressure, by the second end 104 of the channel 8 from the surrounding area 105. In some embodiments, the surrounding area 105 of the substrate 2 can be selectively treated or patterned to enhance the collection of the conductive liquid 16 into the second end 104 of the channel 8. Suitable surface treatment or patterning methods may include, for example, microreplication, flexo printing, screen printing, gravure printing, etc. It is to be understood that any suitable methods can be used to deliver the conductive liquid 16 into the second, distal ends 104 of the channels 8. The conductive liquid 16 can be deposited in any suitable manner, such as, for example, printing, pouring, funneling, micro-injecting, etc.

When the conductive liquid 16 is delivered into the second end 104 of the channel 8, the conductive liquid 16 can be routed, by virtue of a capillary pressure, through the channel 8 from the second, distal end 104 toward the first end 102. While not wanting to be bounded by theory, it is believed that a number of factors can affect the ability of the conductive liquid 16 to move through the channel 8 via capillarity. Such factors may include, for example, the dimensions of the channels, the viscosity of the conductive liquid, surface energy, surface tension, drying, etc. The factors were discussed in U.S. Pat. No. 9,401,306 (Mahajan et al.), which is incorporated herein by reference.

The channel 8 can have any suitable dimensions (e.g., width, depth, or length) which can, in part, be determined by one or more of the factors described above. In some embodiments, the channel 8 may have a width or depth in a range, for example, from about 0.01 microns to about 500 microns, from about 0.05 microns to about 200 microns, or from about 0.1 microns to about 100 microns.

Figure 6B:
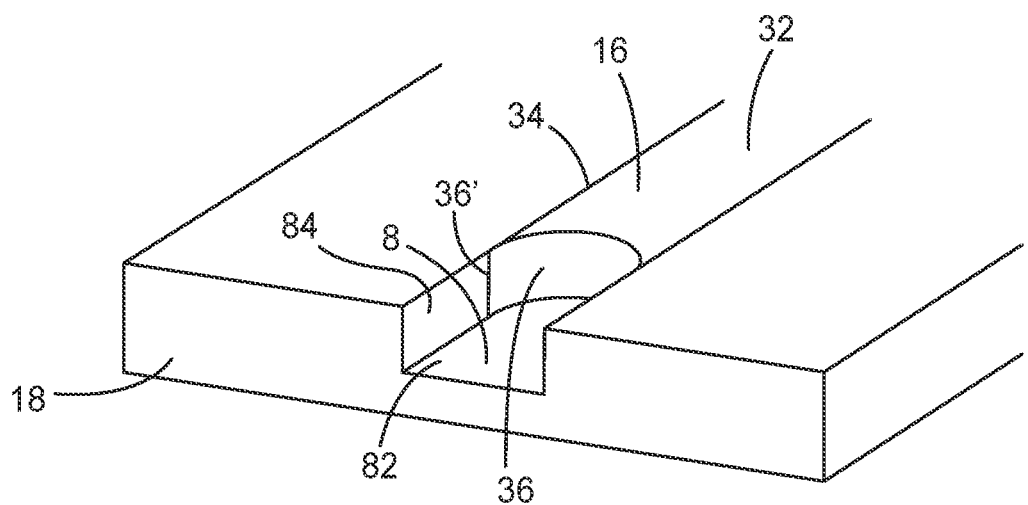
FIG. 6B is a side perspective view of a portion of the substrate of FIG. 6A where a conductive liquid is provided to flow in the channel, according to one embodiment of the present disclosure.
Figure 6C:
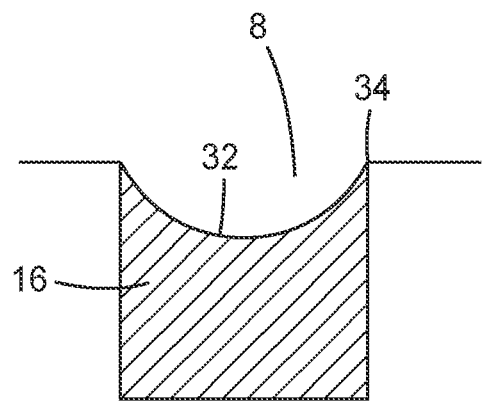
FIG. 6C is a simplified cross-sectional view of the substrate of FIG. 6B where a conductive liquid is provided to flow in the channel, according to one embodiment of the present disclosure.
Figure 6D:
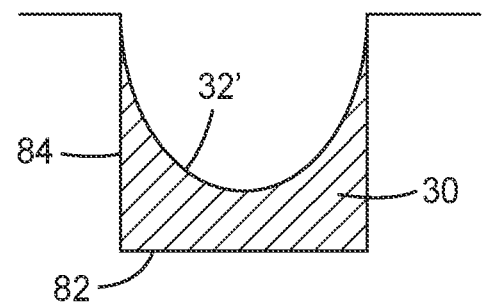
FIG. 6D is a simplified cross-sectional view of the substrate of FIG. 6C where the conductive liquid is solidified to form an electrically conductive trace, according to one embodiment of the present disclosure.
Figure 6E:
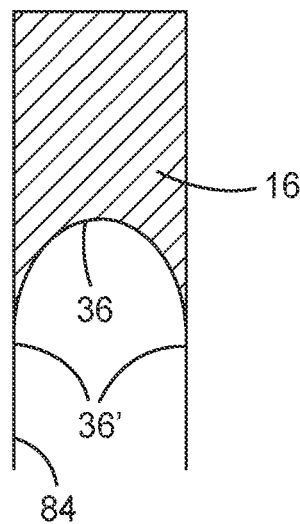
FIG. 6E is a simplified top view of the substrate of FIG. 6C where the conductive liquid is provided to flow in the channel, according to one embodiment of the present disclosure.

Referring to FIGS. 6A-E, when the conductive liquid 16 moves, via capillarity, into the channel 8 from the second end 104 toward the first end 102, the side walls 84 and the bottom wall 82 of the channel 8 can be wetted by the conductive liquid 16 to form one or more curved menisci. It is to be understood that the conductive liquid 16 may be delivered with an amount that covers a portion of the side walls 84 adjacent to the bottom walls 82. As shown in FIGS. 6B-C, the upper surface 32 of the conductive liquid 16 has a convex crescent shape. The edges 34 of the upper surface 32 may serve as pinned contact lines during the flow of the ink 16. As shown in FIGS. 6B and 6E, the front surface 36 of the ink 16 also has a convex crescent shape. The edges 36' of the front surface 36 may serve as leading edges directing the flow forward. The formation of the menisci may generate a pressure gradient that can drive the flow down the capillary with viscous resistance provided by the friction at the capillary walls.

The conductive liquid 16 inside the channel 8 can be solidified to form an electrically conductive trace 30 deposited on both side walls 84 and bottom wall 82 as shown in FIG. 6D. The curvature of the upper surface 32 may increase to form a new upper surface 32'. Suitable processes that can be used to enhance the solidification of the conductive liquid 16 may include, for example, curing or evaporating by heat or radiation. During the process of solidification, the pinned contact line 34 may initiate liquid flow from the center of the channel 8 toward the side walls 84. The volume of the conductive liquid 16 may be decreased by removing the liquid carrier therefrom. The thickness of the deposited solid material may depend on the solid loading of the conductive liquid 16. In some embodiments, the deposited solid material may have a thickness of, for example, from about 0.01 microns to about 200 microns, from about 0.05 microns to about 100 microns, or from about 0.1 microns to about 10 microns.

Figure 4B:
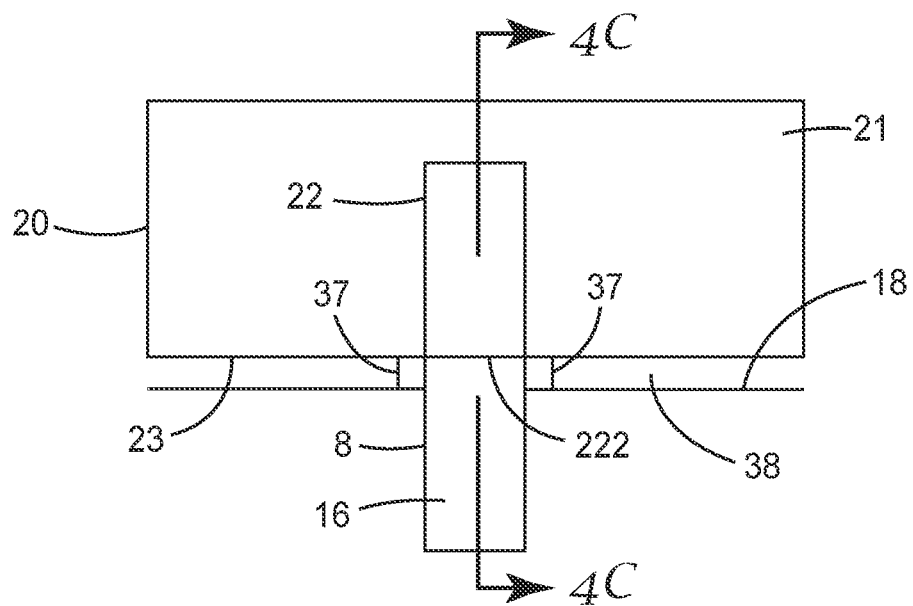
FIG. 4B is an enlarged view of a portion in FIG. 4A.
Figure 4C:
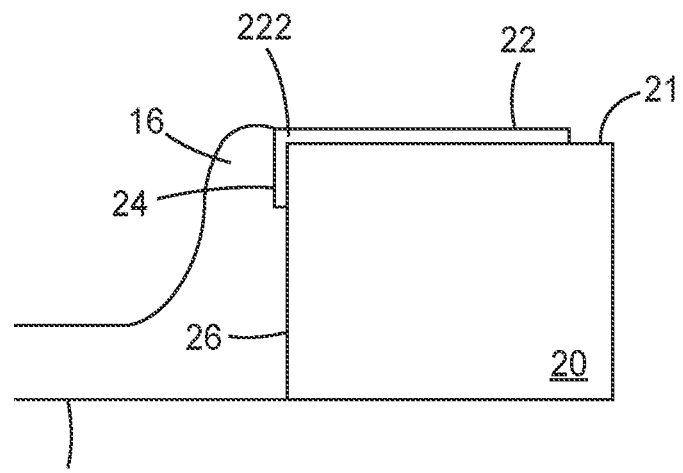
FIG. 4C is a cross sectional view of the portion in FIG. 4B.

Referring to FIGS. 4A-C, when the conductive liquid 16 moves, via capillarity, in the channel 8 and arrives at the first end 102, the front surface 36 of the conductive liquid 16 can wet the side surface 23 of the circuit die 20 that is exposed to the channel 8. The conductive liquid 16 can wet and spread on the exposed portion 26 to cover the side contact pad portion 24, and continue to move onto the edge of the major surface 21 to cover the edge portion 222 of the contact pad 22 on the major surface 21. In some embodiments, the front surface of the conductive liquid 16 can be pinned at the edge portion 222 of the contact pad 22. The conductive liquid 16 may not move further onto the major surface 21 of the circuit die 20, which may leave a major portion of the contact pad 22 not covered by the conductive liquid 16.

In some embodiments, the side surface 23 of the circuit die 20 and the side wall 18 of the pocket 6 may have a gap 38 formed therebetween, as shown FIG. 4B. The gap 38 may facilitate the installing of the circuit die 20 into the pocket 6. In some embodiments, the gap 38 may have a width of, for example, about 10 to about 500 microns, about 10 to about 200 microns, or about 10 to about 100 microns.

In some embodiments, the side contact pad portion 24 may not directly face the channel 8. Instead, the side contact pad portion 24 may face the gap 38. The side contact pact portion 24 and the corresponding channel 8 may be aligned such that the conductive liquid 16 from the channel 8 can first enter the gap 38, reaching and spreading on the side surface 23 of the circuit die 20 to cover the corresponding side contact pad portion 24 thereon.

When the conductive liquid 16 flows in the channel 8 towards the circuit die 20, a portion of the conductive liquid 16 may flow into the gap 38. When two adjacent contact pads 22 are close to each other, the conductive liquid 16 flowing into the gap 38 may undesirably connect the adjacent contact pads 22, inducing possible short circuit issues. In some embodiments, an optional flexible sealing structure 37 can be provided on the side wall 18 of the pocket 6 adjacent to the exit of the channel 8. The sealing structure 37 can be a flexible flange projecting away or from the side wall 18 of the pocket 6, configured to block the flow of conductive liquid 16 from the channel 8 into the gap 38. The sealing structure 37 may be made of the same material as a flexible substrate, and can be a projecting pattern formed, e.g., by microreplication, on the side wall 18 of the pocket 6. Suitable sealing structures may be sufficiently flexible to allow the installation of the circuit die 20 into the pocket 6.

Figure 7A:
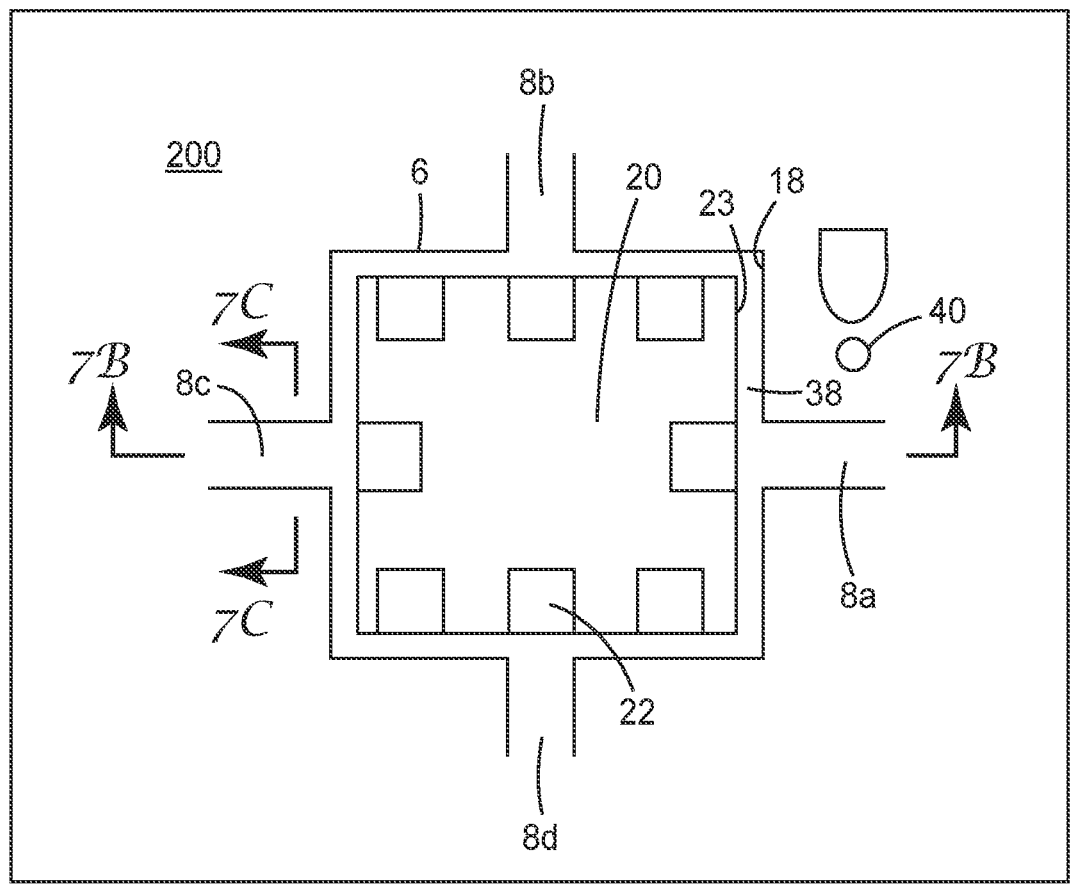
FIG. 7A is a top view of an article including a circuit die disposed in a pocket of a substrate where an adhesive ink is provided from one channel, according to one embodiment of the present disclosure.
Figure 7B:
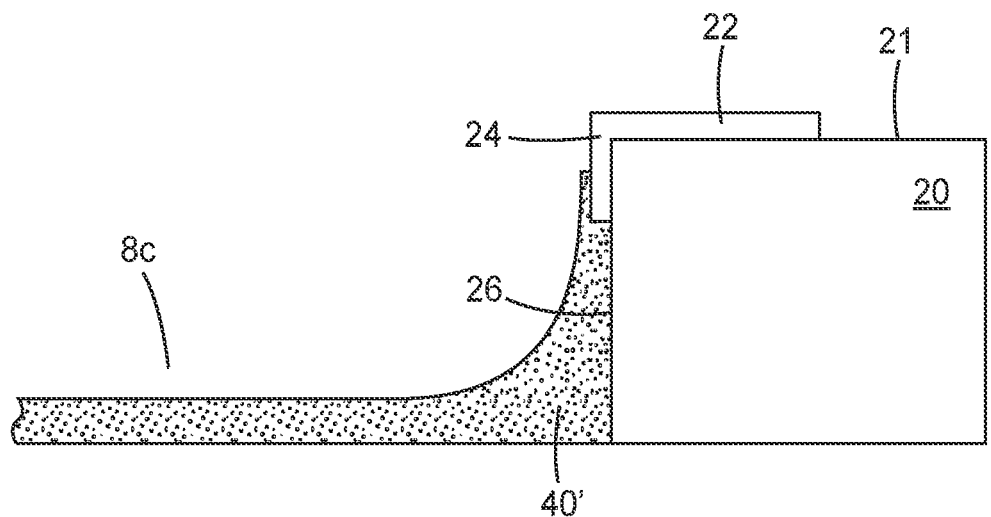
FIG. 7B is a cross section view of the article of FIG. 7A along the cross line 7B-7B.
Figure 7C:
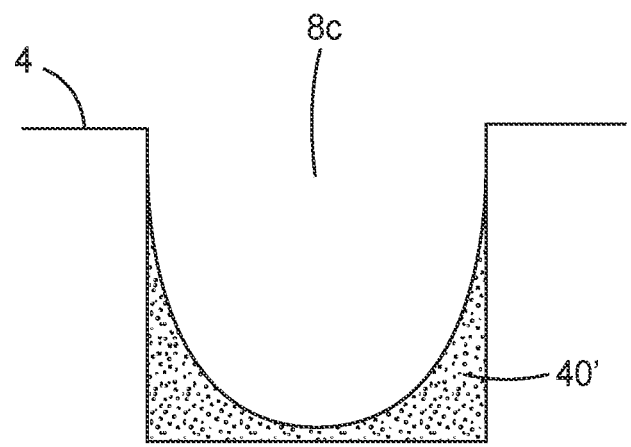
FIG. 7C is a cross section view of the article of FIG. 7A along the cross line 7C-7C.

In some embodiments, the gap 38 between the side surface 23 of the circuit die 20 and the side wall 18 of the pocket 6 can be filled with adhesives. Referring to FIGS. 7A-C showing an article 200, when the circuit die 20 is disposed inside the pocket 6, an adhesive ink 40 can be provided to flow in a channel 8a toward the circuit die 20. The adhesive ink 40 can be a liquid composition that includes a liquid carrier and an adhesive material. The adhesive ink 40 can include, for example, adhesives dissolved in liquid solvents such as water acetone, toluene, methyl ethyl ketone (MEK), etc.

In some embodiments, the adhesive ink 40 can be dispensed into a distal end of the channel 8a, such as the second end 104 of the channel 8 in FIG. 1. The adhesive ink 40 can move, via capillary, through the channel 8a toward the circuit die 20. The adhesive ink 40 can then flow into the gap 38 by wetting the side surfaces (e.g., 23) of the circuit die 20 and the side walls (e.g., 18) of the pocket 6, and into the channels 8b-d downstream of the channel 8a. In this manner, the gap 38 around the periphery of the circuit die 20 can be substantially filled with the adhesive ink 40.

The adhesive ink 40 can then be solidified to form an adhesive layer 40', as shown in FIGS. 7B-C. Suitable processes that can be used to enhance the solidification of the adhesive ink 40 may include, for example, curing or evaporating by heat or radiation. In some embodiments, the liquid carrier of the adhesive ink 40 can be evaporated from the channels 8a-d and the gap 38, leaving the adhesive material to form the adhesive layer 40'. When the liquid carrier is removed, the remaining adhesive material can be deposited in the gap 38 and on the side walls and bottom walls of the channels 8a-d. In some embodiments, the gap 38 can be substantially filled with the adhesive material 40'. In some embodiments, a bottom portion of the gap 38 may be filled with the adhesive material 40'. In some embodiments, the channels can be left partially filled with the adhesive material. The adhesive layer 40' may form a conformal layer covering the side and bottom walls of the channels.

Referring to FIG. 7B, it is to be understood that the adhesive material 40' may cover a portion of the exposed portion 26 of the side surface 23 of the solid circuit die 20. In some embodiments, the adhesive material 40' may cover a lower portion of the side contact pad portion 24 and an upper portion is still exposed. In some embodiments, when the adhesive ink 40 is only provided from one channel (e.g., 8a), the side contact pad portion 24 that faces that channel (e.g., 8a) may be completely covered by the adhesive material 40', while other side contact pad portions 24 aligned with other channels (e.g., 8b-c) may have at least a portion not covered by the adhesive material 40'.

Figure 8A:
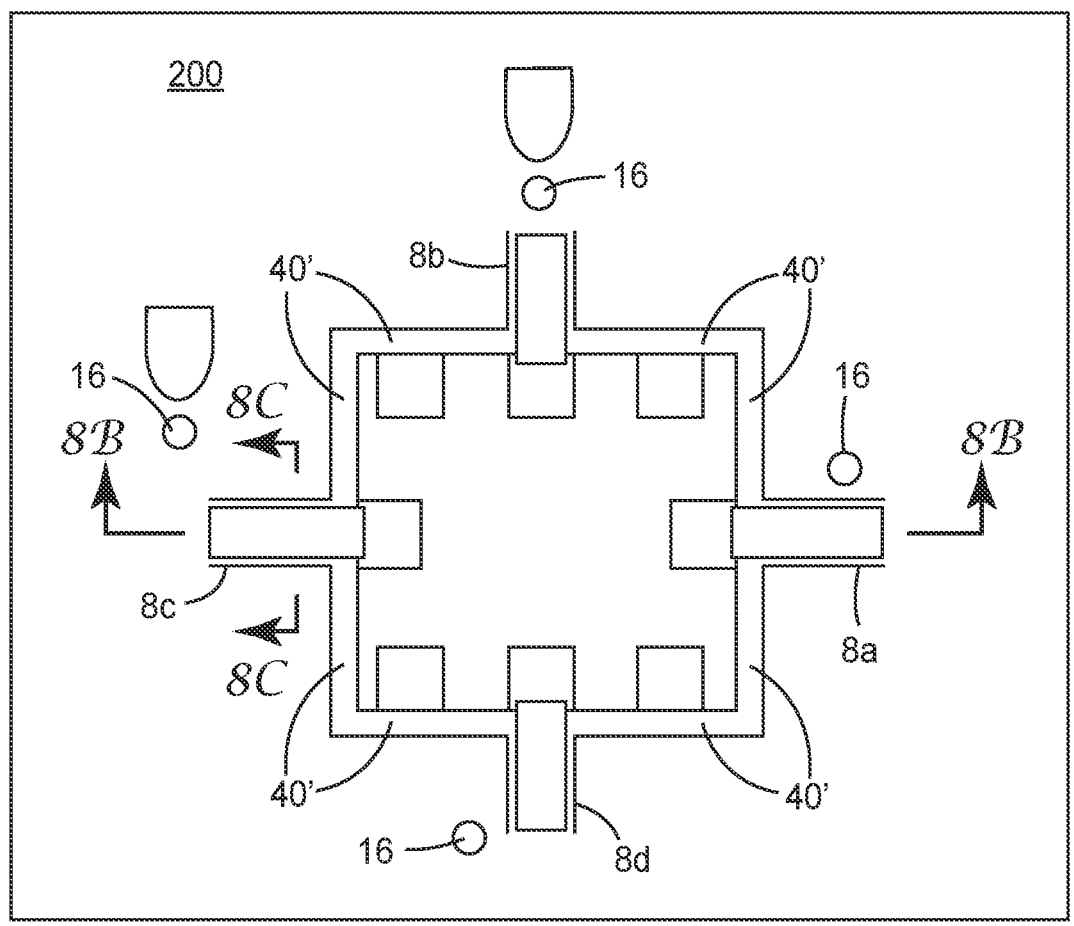
FIG. 8A is a top view of the article of FIG. 7A where a conductive liquid is provided from the channels to form electrically conductive traces, according to one embodiment of the present disclosure.
Figure 8B:
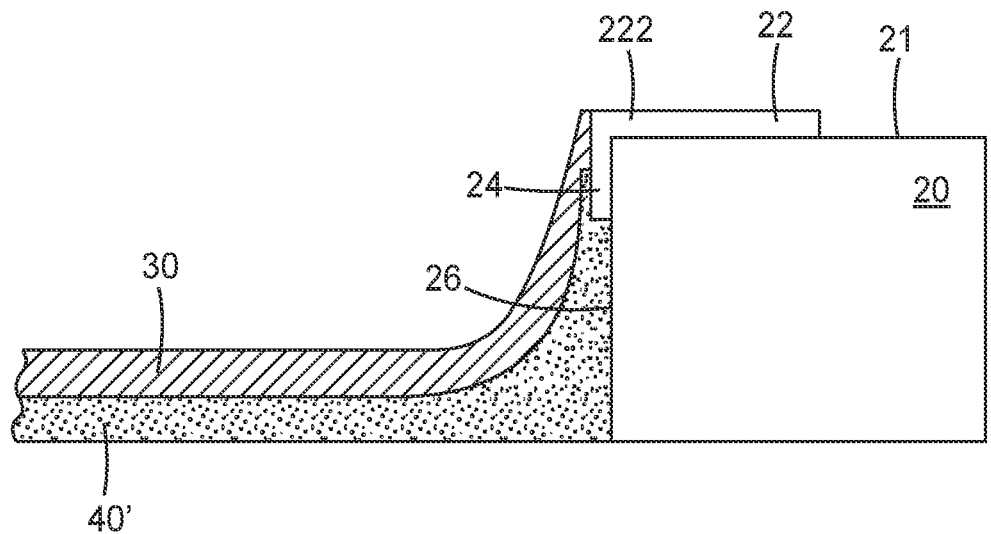
FIG. 8B is a cross section view of the article of FIG. 8A along the cross line 8B-8B.
Figure 8C:
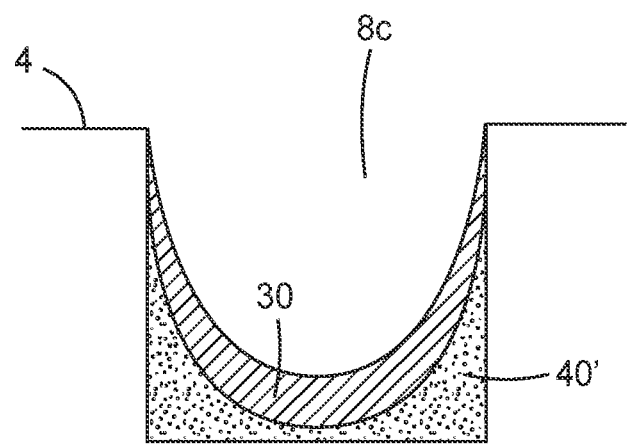
FIG. 8C is a cross section view of the article of FIG. 8A along the cross line 8C-8C.

With the gap 38 being filled with the adhesive material 40' and the walls of channels 8a-d being covered with the adhesive material 40', additional material can be provided onto the adhesive layer 40' in the channels to form electrically conductive traces. FIGS. 8A-C illustrate an embodiment where the conductive liquid 16 is provided to form electrically conductive traces 30 in the channels 8a-d. The conductive liquid 16 can be dispensed into the respective distal ends of the channels 8a-d. The conductive liquid 16 can move, via capillary, through the respective channels 8a-d by wetting the adhesive layer 40' on the walls thereof, and flow toward the circuit die 20.

When the conductive liquid 16 meets the side wall 23 of the circuit die 20, it can wet out and spread on the exposed portion 26 to cover the side contact pad portion 24, and continue to move to cover the edge portion 222 of the contact pad 22 on the major surface 21 of the circuit die 20. The conductive liquid 16 may not enter the gaps 38 any more since the gaps may be completely filled with the adhesive material 40'. In some embodiments, the front surface of the conductive liquid 16 can be pinned at the edge portion 222 of the contact pad 22 on the circuit die 20. The conductive liquid 16 may not move further onto the major surface 21 of the circuit die 20, which may leave a major portion of the contact pad 22 on the major surface 21 not covered by the conductive liquid 16.

The conductive liquid 16 can then be solidified to form the electrically conductive traces 30 in the channels 8a-d, covering the adhesive layer 40'. Suitable processes that can be used to enhance the solidification of the conductive liquid 16 may include, for example, curing or evaporating by heat or radiation. As shown in FIG. 8B, the electrically conductive trace 30 extends to the edge portion 222 of the contact pad 22 on the circuit die 20, and directly contacts the side contact pad portion 24 and the edge portion 222.

Figure 9A:
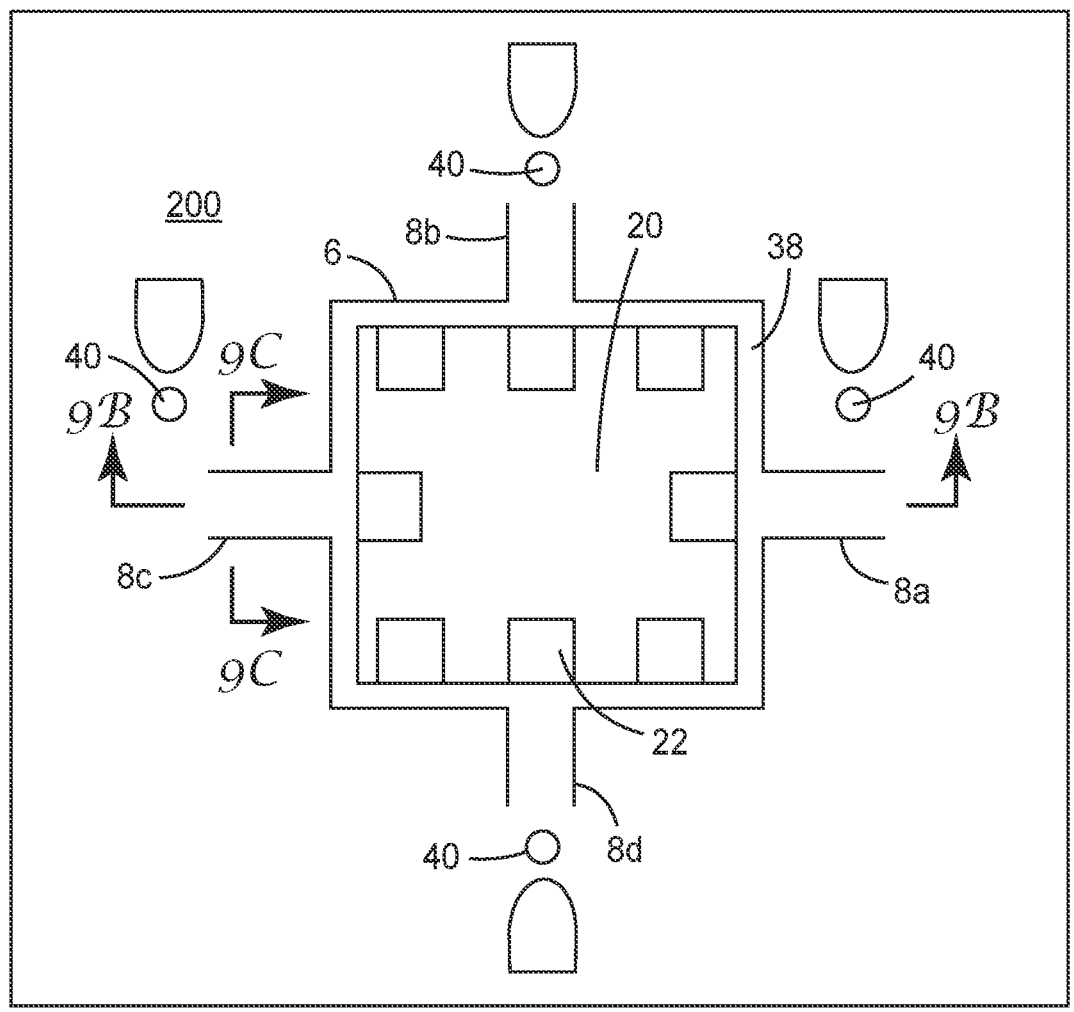
FIG. 9A is a top view of an article including a circuit die disposed in a pocket of a substrate where an adhesive ink is provided from all channels, according to one embodiment of the present disclosure.
Figure 9B:
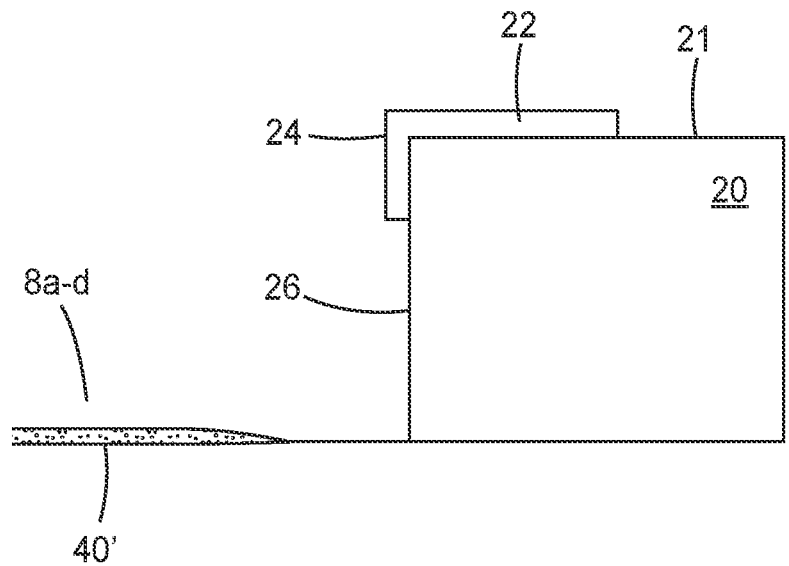
FIG. 9B is a cross section view of the article of FIG. 9A along the cross line 9B-9B.
Figure 9C:
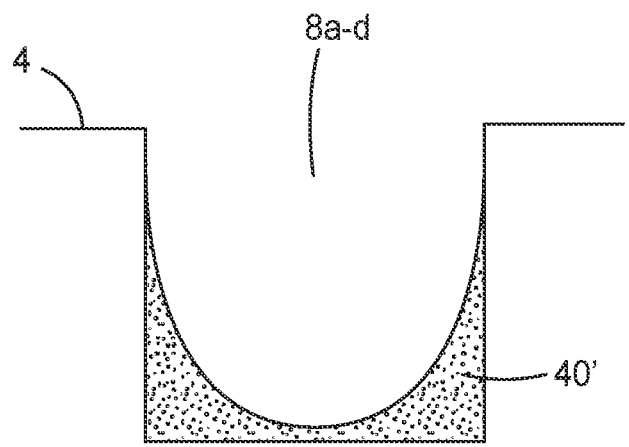
FIG. 9C is a cross section view of the article of FIG. 9A along the cross line 9C-9C.

In some embodiments, the gap 38 between the periphery of the circuit die 20 and the side walls of the pocket can be at least partially filled by providing the adhesive ink 40 into each of the channels 8a-d. Referring to FIGS. 9A-C, when the circuit die 20 is disposed inside the pocket 6, the adhesive ink 40 can be provided to flow in each of the channels 8a-d toward the circuit die 20.

In some embodiments, the adhesive ink 40 can be dispensed into the respective distal ends of the channels 8a-d. The adhesive ink 40 can move, via capillary, through the respective channels 8a-d toward the circuit die 20. The adhesive ink 40 can then flow from the respective channels 8a-d into the gap 38 by wetting out the side surfaces (e.g., 23) of the circuit die 20 and the side walls (e.g., 18) of the pocket 6. In this manner, the gap 38 between the side surfaces of the circuit die 20 and the side walls of the pocket 6 can be at least partially filled with the adhesive ink 40.

The adhesive ink 40 can then be solidified to form the adhesive layer 40', as shown in FIGS. 9B-C. Suitable processes that can be used to enhance the solidification of the adhesive ink 40 may include, for example, curing or evaporating by heat or radiation. In some embodiments, the liquid carrier of the adhesive ink 40 can be evaporated from the channels 8a-d and the gap 38, leaving the adhesive material to form the adhesive layer 40'. When the liquid carrier is removed, the remaining adhesive material can be deposited in the gap 38 and on the side walls and bottom walls of the channels 8a-d. At least the portion of the gap 38 adjacent to the respective channels 8a-d can be substantially filled with the adhesive material 40'. In some embodiments, the channels can be left partially filled with the adhesive material. The adhesive layer 40' can form a conformal layer covering the side and bottom walls of the channels 8a-d.

Referring to FIG. 9B, it is to be understood that in some embodiments, the adhesive material 40' may not cover the exposed portion 26 of the side wall 23 of the solid circuit die 20. Instead, the adhesive ink 40 can be directed, via capillary, into the gap 38, without touching the exposed portion 26 of the side surface 23 of the solid circuit die 20.

Figure 10A:
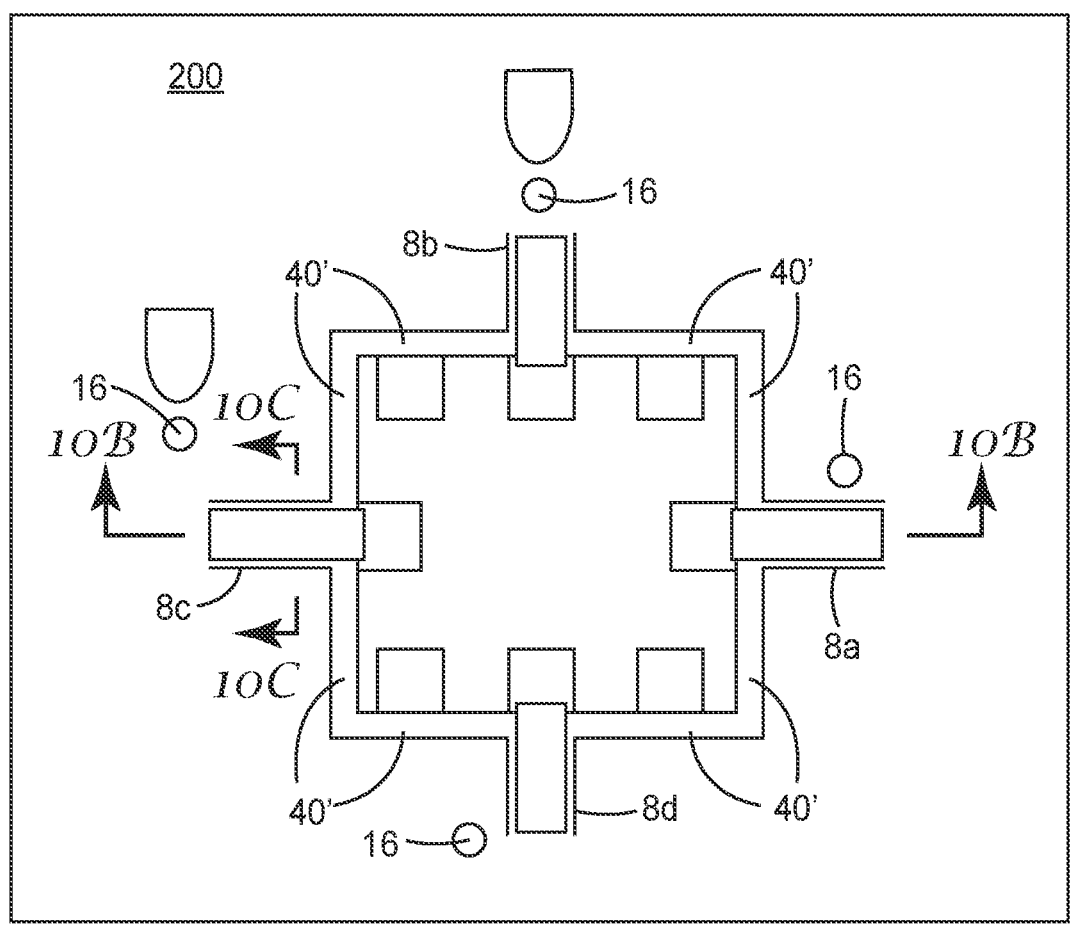
FIG. 10A is a top view of the article of FIG. 9A where a conductive liquid is provided from the channels to form electrically conductive traces, according to one embodiment of the present disclosure.
Figure 10B:
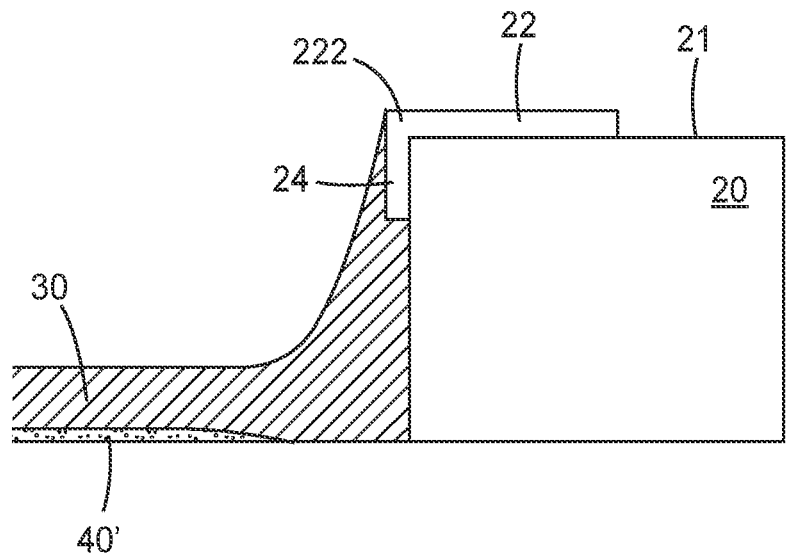
FIG. 10B is a cross section view of the article of FIG. 10A along the cross line 10B-10B.
Figure 10C:
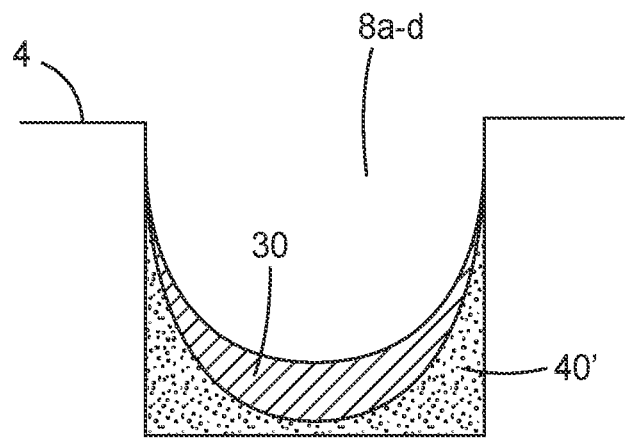
FIG. 10C is a cross section view of the article of FIG. 10A along the cross line 10C-10C.

With the gap 38 being at least partially filled with the adhesive material 40' and the walls of channels 8a-d being covered with the adhesive material 40', additional material can be provided on the adhesive layer 40' in the channels 8a-d. FIGS. 10A-C illustrate an embodiment where the conductive liquid 16 is provided to form electrically conductive traces 30 in the channels 8a-d. The conductive liquid 16 can be dispensed into the respective distal ends of the channels 8a-d. The conductive liquid 16 can move, via capillary, through the respective channels 8a-d by wetting the adhesive layer 40' on the walls thereof, and flow toward the circuit die 20.

When the conductive liquid 16 meets the respective side surfaces 23 of the circuit die 20, it can wet out and spread on the respective exposed portions 26 to cover the side contact pad portions 24, and continue to move to cover the edge portion 222 of the contact pad 22 on the major surface 21. The conductive liquid 16 may not enter the gaps 38 any more since the gaps may be completely filled with the adhesives 40'. In some embodiments, the front surface of the conductive liquid 16 can be pinned at the edge portion 222 of the contact pad 22 of the circuit die 20. The conductive liquid 16 may not move further onto the major surface 21 of the circuit die 20, which may leave a major portion of the contact pad 22 not covered by the conductive liquid 16.

The conductive liquid 16 can then be solidified to form the electrically conductive traces 30 in the channels 8a-d, covering the adhesive layer 40'. Suitable processes that can be used to enhance the solidification of the conductive liquid 16 may include, for example, curing or evaporating by heat or radiation. As shown in FIG. 10B, the electrically conductive trace 30 extends to the edge portion 222 of the contact pad 22 on the circuit die 20, and directly contacts the side contact pad portion 24 and the edge portion 222.

The present disclosure provides processes for automatic registration between an electronic component (e.g., a solid circuit die) and electrically conductive interconnects, and articles or devices made by the same are provided. The solid circuit die is disposed on a substrate with contact pads aligned with channels on the substrate. Electrically conductive traces are formed by flowing a conductive liquid in the channels toward the contact pads to obtain the automatic registration.

In some embodiments, the substrate can have a registration feature shaped to receive the electronic component, and at least one channel shaped to extend away an area that corresponds with one of the contacts when the electronic component is disposed within the registration feature. A conductive liquid can be dispensed within the channel such that the conductive liquid flows by capillary in the channel toward and wets the contacts. The conductive liquid can be solidified to form a conductive trace in the channel. In some embodiments, the at least one channel further includes an enlarged portion shaped to provide a convenient receptacle for the dispensed adhesive ink or conductive liquid. For example, one end of the channel can be fluidly connected to a reservoir to facilitate liquid delivery.

In the present disclosure, the liquid or ink delivered into the channels can automatically register with the circuit dies by wetting out, via capillary, various surfaces of registration features and circuit dies on the substrate (e g, channel walls, side walls of the pocket, side surfaces of the circuit die, etc.). The flow of liquid on the various capillary surfaces can be automatically directed by a capillary force, eliminating the necessity of using fluid pumps to pump the fluid toward the circuit die. After the automatic registration, the liquid or ink can be further solidified or dried to form a solid, continuous layer. The process can be repeated to form a multilayer structure aligned with the solid circuit die on the substrate.

In some embodiments, after the formation of electrically conductive traces in the channels, the channels can be filled with an encapsulant material to protect the structure. The encapsulant material may include, for example, a dielectric material, a polymeric material, etc. In some embodiments, the encapsulant material can be delivered as a capillary liquid flow to fill the channels. The liquid can also flow toward the pocket to cover the circuit die installed therein. The liquid can then be solidified to form an encapsulant material to protect the underneath traces, circuit dies, and contacts formed therebetween. It is to be understood that the encapsulant material may be provided by any other suitable processes to cover the traces and circuit dies.

When electrically conductive traces are formed and automatically registered with contact pads on circuit dies, the traces can be connected to other portions of a circuit or other circuits or devices. In some embodiments, additional metal traces (e.g., Cu traces) can be patterned in registration to the electrically conductive traces. In some embodiments, the electrically conductive traces can be connected to an antenna coil of an electronic device such as a receiver or transmitter. The processes described herein can be used to make various chip-based circuits/devices including, for example, radio-frequency identification (RFID) tags, near field communication (NFC) circuits, Bluetooth circuits, Wi-Fi circuits, microprocessor chips, etc.

In many applications, a solid circuit die may have its contact pads disposed on a major surface (e.g., a top or bottom surface), not on its side surfaces. For example, as shown in FIGS. 5A-B, the contact pads 22 may be disposed on the major surface 21, not extending to the side surface 23, e.g., having no side portions 24. The present disclosure provides embodiments on how to achieve micron-level registration between such solid circuit dies and electrically conductive interconnects on a substrate, in particular, a moving, stretchy flexible substrate. When a circuit die is disposed inside a pocket on a substrate, the circuit die can be positioned to have the major surface with the contact pads facing down, i.e., having the contact pads in contact or close proximate with the bottom surface of the pocket. One or more channels formed on the substrate can extend into the pocket and reach the bottom contacts of the circuit die. Electrically conductive traces can be formed in the channels and extend to be in direct contact with the bottom contact pads of the solid circuit die.

Figure 11A:
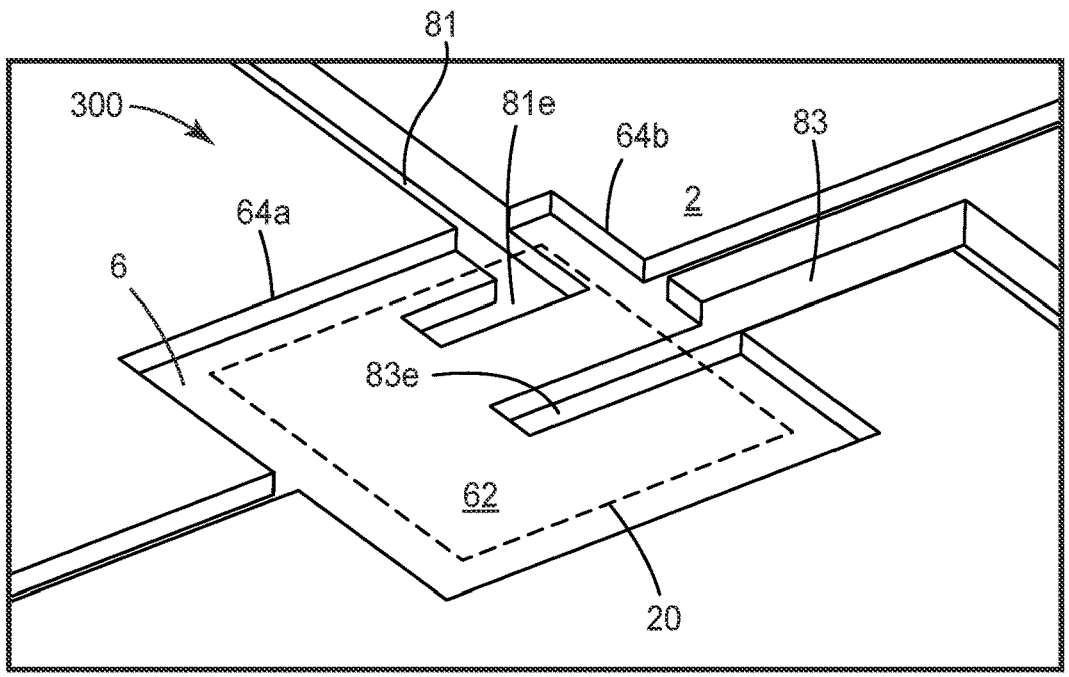
FIG. 11A is a perspective view of an article including a pocket and channels extending into the pocket, according to one embodiment.
Figure 11B:
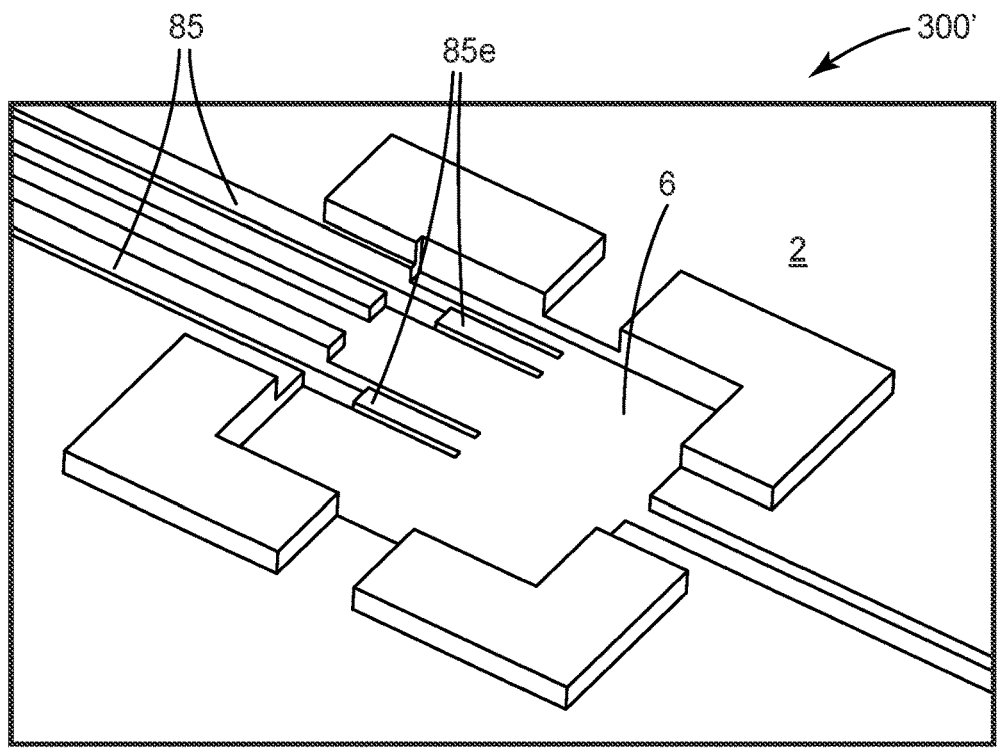
FIG. 11B is a perspective view of an article including a pocket and channels extending into the pocket, according to another embodiment.

FIG. 11A is a perspective view of an article 300 including the pocket 6 and one or more channels extending into the pocket 6, according to one embodiment. The pocket 6 and channels 81 and 83 are formed on the substrate 2. The channel 81 extends across the side wall 64a of the pocket 6 and has its end 81e formed on the bottom surface 62 of the pocket 6; the channel 83 extends across the side wall 64b of the pocket 6 and has its end 83e formed on the bottom surface 62 of the pocket 6. As shown in FIG. 11A, the channels can have the ends extending to be under the circuit die 20. FIG. 11B is a perspective view of an article 300' including the pocket 6 and channels 85 extending into the pocket 6, according to another embodiment. The ends 85e of the channels 85 each have a fork configuration. The fork configuration can provide additional length to the channel under the circuit die with a limited space. The additional length may aid in pushing the trapped air in the channels away from the contact pads.

When a circuit die is disposed into the pocket 6, the bottom contacts of the circuit die can be aligned with the ends of the channels inside the pocket 6. Electrically conductive traces can be formed in the channels and extend to be in direct contact with the bottom contact pads of the solid circuit die. It is to be understood that the ends of the channel inside the pocket 6 can have various configurations so that the electrically conductive traces formed therein can have excellent contact with the bottom contact pads of the circuit die.

Figure 12:
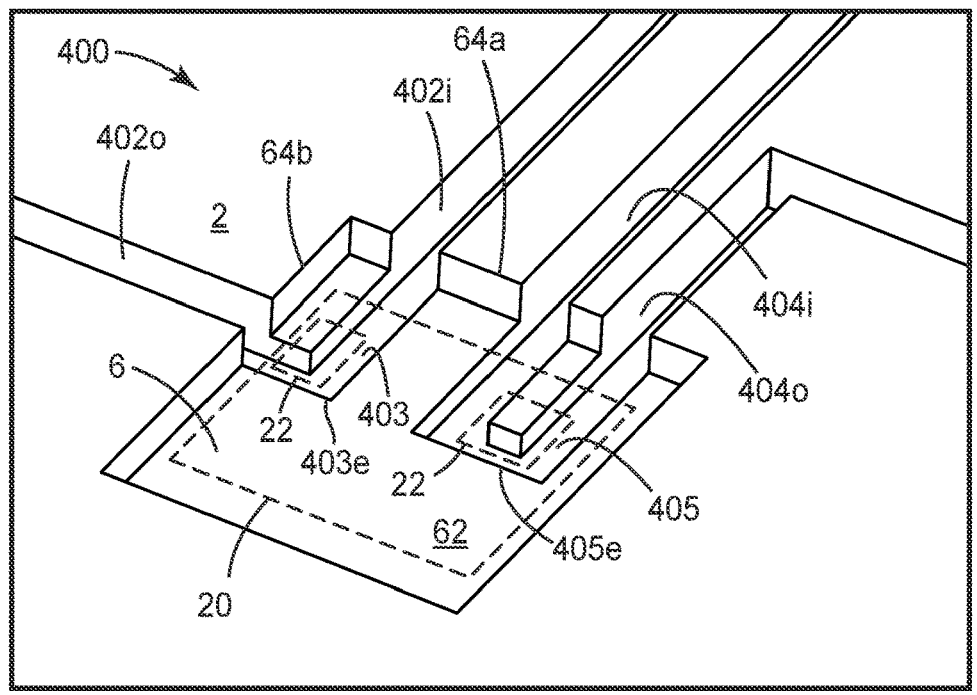
FIG. 12 is a perspective view of an article including an inlet channel and an outlet channel fluidly connected inside a pocket, according to one embodiment.

FIG. 12 is a perspective view of an article 400 including one or more pairings of inlet and outlet channels formed on the substrate 2, according to one embodiment. A pairing of inlet channel 402i and outlet channel 402o each extends across the side wall 64a or 64b into the pocket 6, having the respective ends fluidly connected inside the pocket 6 to form an inner channel 403. The inner channel 403 has an "L" shape. Another pairing of inlet channel 404i and outlet channel 404o each extends across the side wall 64a into the pocket 6, having the respective ends fluidly connected inside the pocket 6 to form an inner channel 405. The inner channel 405 has a "U" shape. While the embodiment of FIG. 12 illustrates a pairing of inlet and outlet channels fluidly connected inside the pocket, it is to be understood that in some embodiments, two or more inlet channels can be fluidly connected to one outlet channel; in some embodiments, one inlet channel can be fluidly connected to two or more outlet channels. It is also to be understood that some inlet or outlet channels are not fluidly connected to avoid a short circuit between different contact pads. In some embodiments, the channels may have a width, for example, in a range from about 5 to about 500 micrometers.

When a circuit die is disposed into the pocket 6, the bottom contacts of the circuit die can be aligned with a portion of the inner channel 403 or 405. A conductive liquid can flow, primarily by a capillary pressure, in the inlet channel 402i or 404i into the inner channel 403 or 405 to make direct contact with the bottom contact pads of the solid circuit die. Excess liquid can flow out of the pocket via the outlet channel 402o or 404o. The inlet and outlet channels (e.g., 402i and 402o, or 402i and 402o) are fluidly connected via the respective inner channels (e.g., 403 or 405), which can help to ensure a continuous liquid flow without trapping air in the inner channels. In this manner, excellent contacts can be formed between the conductive liquid and the bottom contact pads of the solid circuit die.

As shown in FIG. 12, at least a portion of the inner channel 403 or 405 extends underneath the circuit die 20 where electrical contacts are formed between the contact pads 22 and the conductive liquid in the inner channel 403 or 405. It is to be understood that an inner channel (e.g., 403 or 405) formed by fluidly connecting an inlet channel and an outlet channel can have various configurations or shapes such as, for example, a "U" shape, an "L" shape, a straight-line shape, a curved-line shape, etc., so that the electrically conductive traces formed therein can have excellent contact with the bottom contact pads 22 of the circuit die 20.

In some embodiments, the inner channel 403 or 405 can be shaped such that the bottom contact pads 22 of the circuit die 20 are positioned within the respective outer edges 403e and 405e of the inner channels 403 and 405. When the circuit die 20 is attached to the bottom surface 62 of the pocket 6 via a liquid adhesive, the outer edges 403 and 405e of the channels can stop the movement (e.g., by pinning) of the liquid adhesive (e.g., from a central portion of the pocket 6 towards the contact pads 22) and prevent possible contamination to the contact pads 22.

In some embodiments, a conductive liquid can flow into the channels (e.g., the inner channel 403 or 405) via the inlet channels (e.g., 402*i* or 404*i*), solidified to form electrically conductive traces therein. For example, the electrically conductive traces can be formed by evaporation of a solvent of liquid conductive ink. During a solidification process, the conductive material can be deposited on the side walls and bottom of the channels, and on a portion of the bottom face of the circuit die sitting atop the channel. In the process, the conductive material can make a conformal contact with the contact pads on the circuit die. The solidification process may leave some void space in the channels underneath the circuit die. The void space can be filled with an encapsulant material to protect the structure. The encapsulant material may include, for example, a dielectric material, a polymeric material, etc. In some embodiments, the encapsulant material can be delivered as a capillary liquid flow to fill the channels. The liquid can also flow into the inner channels, and can then be solidified to reinforce the contact interface formed between the electrically conductive traces and the contact pads of the circuit die.

Figure 13:
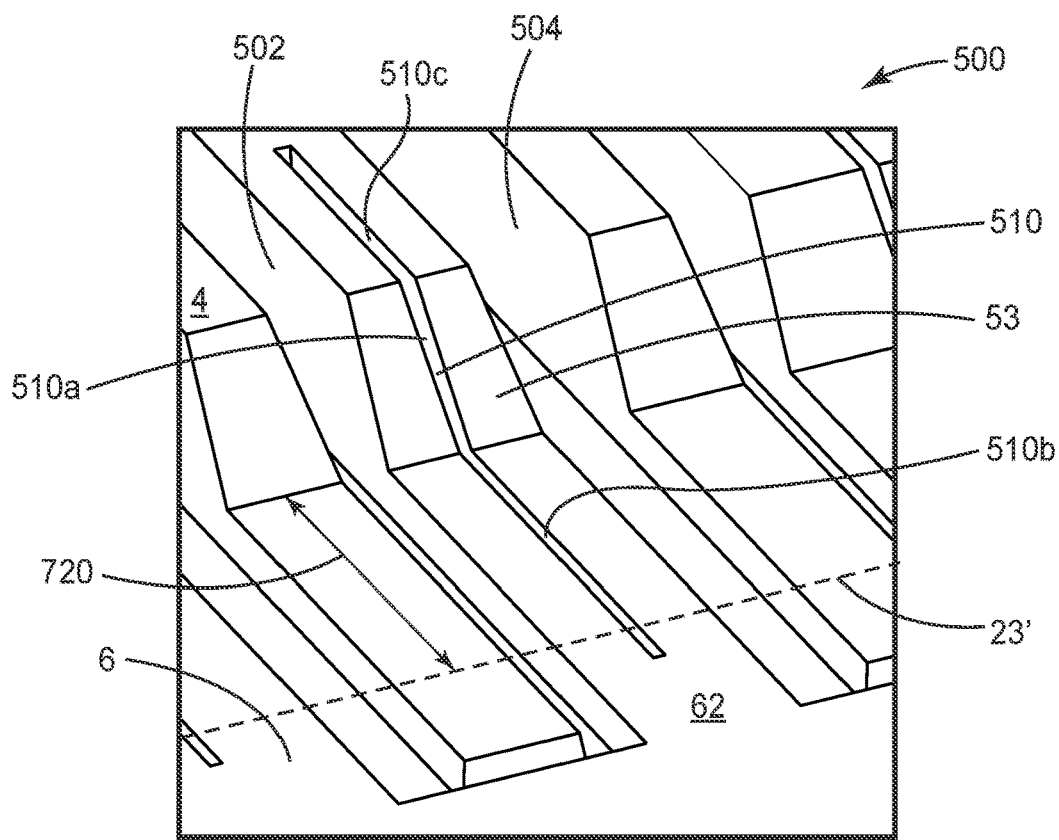
FIG. 13 is a perspective portion view of an article including a safety channel, according to one embodiment.

FIG. 13 is a perspective portion view of an article 500 including a safety channel 510, according to one embodiment Channels 502 and 504 each extend across a side wall 64 of the pocket 6 into the pocket 6. In the depicted embodiment of FIG. 13, the channels 502 and 504 each include a pairing of inlet and outlet channels. The safety channel 510 extends across the side wall 64 of the pocket 6, and is positioned between the adjacent channels 502 and 504. In some embodiments, the safety channel 510 can extend in a direction substantially parallel to the adjacent channel 502 or 504. The safety channel 510 has a first portion 510*a* formed into the side wall 64 of the pocket 6, and a second portion 510*b* formed into the bottom surface 62 of the pocket 6. The safety channel 510 has an optional portion 510*c* formed into the substrate surface 4. The safety channel 510 can effectively prevent leaking from adjacent channels (e.g., 502 and 504) when conductive liquid flow in the respective channels (e.g., 502 and 504). While not wanting to be bound by theory, it is believed that the safety channel works on the principle of pinning of advancing liquid fronts at sharp edges. So, the liquid that leaks out of a channel gets pinned to the sharp edge of the safety channel, preventing any further flow along the edge of the pocket or the circuit die. The leaked liquid gets pinned, accumulates at the edge of the safety channel, and may not fall into the safety channel at all, thereby preventing contact with the leaked liquid from the adjacent channel.

The first portion 510*a* may run across the side wall 64 in a plane substantially perpendicular to the bottom surface 62 of the pocket 6, which can effectively prevent liquid leaking from the channels along the side wall of the pocket. The first portion 510*a* can extend continuously into the pocket 6 to form the second portion 510*b* which can extend to be beneath a circuit die that is disposed in the pocket 6. As shown in FIG. 13, the second portion 510*b* extends beyond the dashed line 23' that indicates the footage of an edge of the circuit die, which can effectively prevent liquid leaking from the channels along the edge or side wall of the circuit die. In this manner, the safety channel 510 can stop fluid communication or crosstalk between adjacent channels and prevent an electrical short circuit therebetween. There is a gap 720 between the edge of the circuit die and the side wall 64 of the pocket 6, which will be discussed further below.

While the embodiment of FIG. 13 illustrates a safety channel between adjacent channels each including a pairing of inlet and outlet channels, it is to be understood that in some embodiments, one or more safety channels can be disposed adjacent to any channel (e.g., an inlet channel, an outlet channel, etc.) to prevent liquid leaking from that channel along a surface (e.g., a surface of a pocket, a surface of a circuit die, a surface of a substrate, etc.). Liquid from that channel leaking along a surface can become pinned at the edge of the safely channel A safety channel can be positioned, for example, about 5 to about 50 micrometers away from the channel to be protected. In some embodiments, the safety channel may be narrower than the adjacent channel for which it can prevent leakage. For example, the safety channel may have a width in a range from about 5 to about 5 micrometers.

Figure 14:
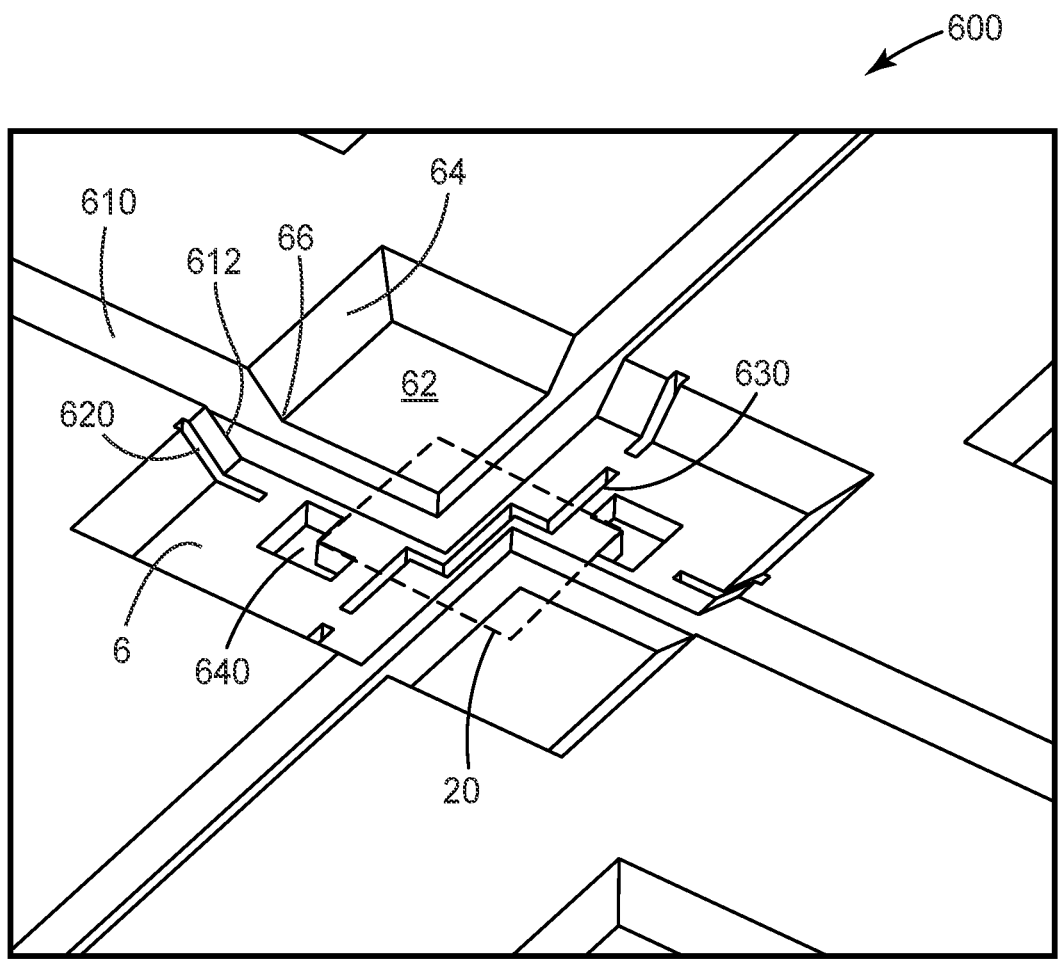
FIG. 14 is a perspective view of an article including a sloped entrance, according to one embodiment.

FIG. 14 is a perspective view of an article 600 including a pocket 6 having a sloped entrance, according to one embodiment. The pocket 6 has the bottom surface 62 and at least one side wall 64. The side wall 64 has a sloped shape with respect to the bottom surface 62. The side wall 64 is inclined away from the bottom surface 62. The angle between the side wall 64 and the bottom surface normal 66 can be in the range, for example, from about 10° to about 80°, from about 30° to about 60°, or from about 40° to about 50°. A channel 610 (e.g., an inlet channel, or an outlet channel) extends across the sloped side wall 64 to form a sloped entrance 612. The sloped entrance 612 can prevent liquid leaking from the channel 610 onto the side wall 64 when the conductive liquid flows from the channel 610 into the pocket 6. In the embodiment depicted in FIG. 14, a safety channel 620 is positioned adjacent to the sloped entrance to further prevent liquid leaking.

In some embodiments, before flowing the conductive liquid into the pocket 6, the circuit die 20 can be attached to the bottom surface 62 of the pocket 6 via a liquid adhesive such as shown in FIG. 2. In the embodiment of FIG. 14, the liquid adhesive can be provided into an adhesive channel 630 for die adhering. In some embodiments, one or more reservoirs can be formed on the bottom surface 62 of the pocket 6 to receive liquid adhesives, which can flow from the reservoirs, primarily by a capillary pressure, into the adhesive channels to adhere the circuit die 20 to the bottom surface 62 of the pocket 6. The adhesive channels or reservoirs are not in fluid communication with the channel 610. One or more fiducials 640 are provided to precisely align the circuit die 20 with the channels.

In some embodiments, the liquid adhesive can be provided before placing the circuit die 20 into the pocket 6. In some embodiments, the liquid adhesive can be delivered to the pocket 6 as a single drop at the center of the pocket 6 or as a myriad of drops in a specific pattern depending on the size and specifics of the circuit die 20. Isolated reservoirs can also be positioned at the bottom of the circuit die 20 to catch and pin the liquid adhesive in pre-defined locations. When the circuit die 20 is placed atop the liquid adhesive, the adhesive can wet out the space between the circuit die 20 and the pocket 6, while getting pinned at the edges of the channels (e.g., inner channels connected to the channel 610 for forming electrically conductive traces) under the circuit die 20. This adhesive patterning scheme can help to attach the circuit die 20 to the pocket 6 without contaminating the contact pads on the circuit die 20.

Figure 15:
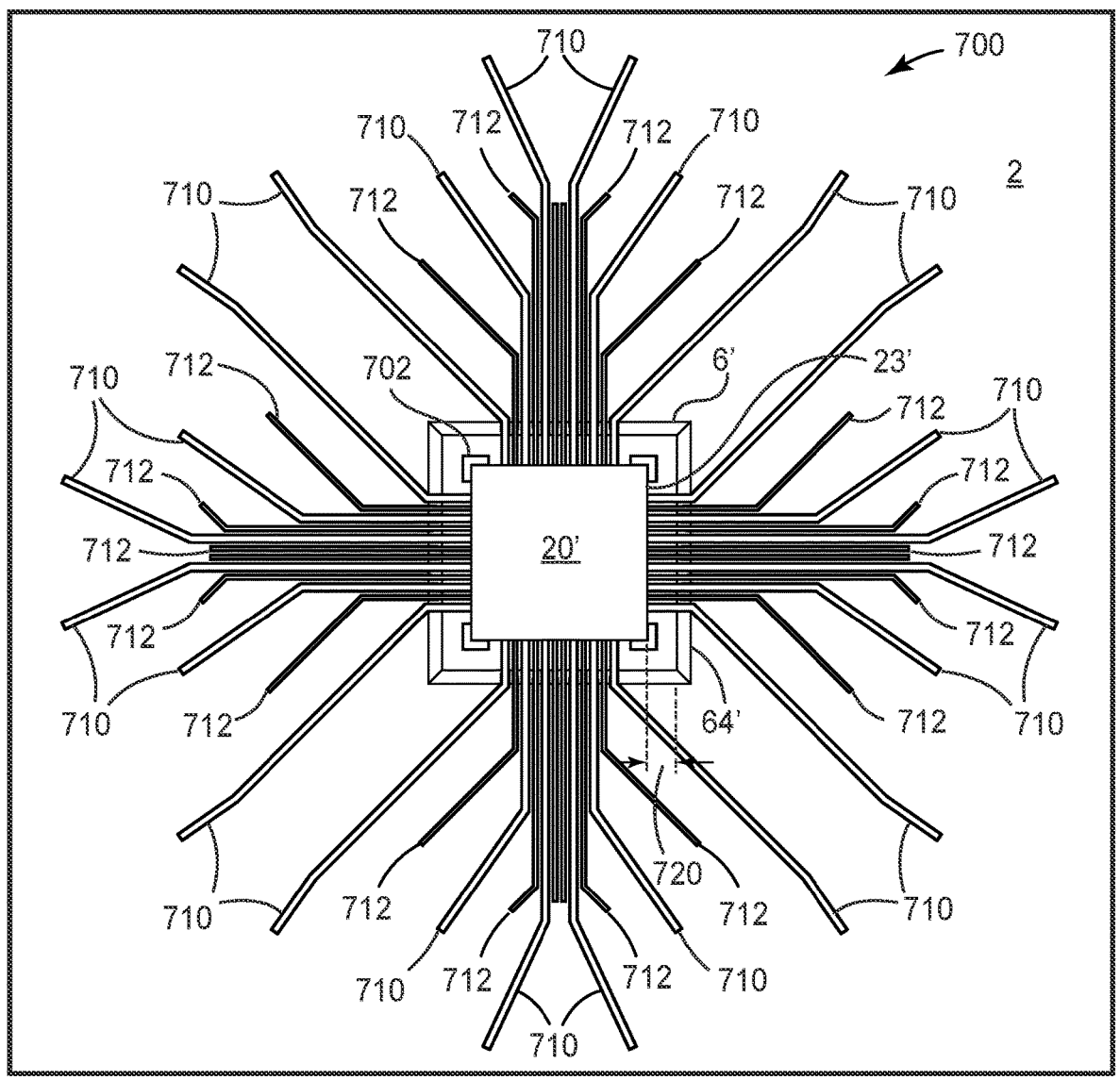
FIG. 15 is a perspective portion view of an article including an oversized pocket to receive a solid circuit die, according to one embodiment.

FIG. 15 is a top portion view of an article 700 including an oversized pocket 6' to receive a solid circuit die 20', according to one embodiment. The pocket 6' is formed on the substrate 2, having a size larger than that of the solid circuit die 20'. When the solid circuit die 20' is disposed in the pocket 6', facing down to the bottom surface 62' of the pocket 6', the bottom contact pads thereon are aligned with the channels 710 extending into the pocket 6'. The channels 710 can include one or more inlet channels, outlet channels, etc. Safety channels 712 are provided to prevent liquid leakage from the channels 710. One or more fiducial marks 702 can be provided inside the pocket 6' for the precise alignment. There is a gap 720 between the side wall or edge 23' of the solid circuit die 20' and the side wall 64' of the pocket 6'. When the side wall of the pocket has a sloped shape, the gap 720 may refer to the in-plane distance between the side wall of the pocket and the circuit die edge on the bottom surface 62 of the circuit die such as illustrated in FIG. 13.

The gap 720 can be greater than the tolerance that is required to position the circuit die into the pocket. For example, a typical tolerance may be, for example, from about 10 to about 20 micrometers, generally less than about 50 micrometers. With such a tolerance, i.e., a small gap between the side walls of the pocket and the circuit die, the conductive fluid flowing in the channels may wick into the small gap and undesirably connect adjacent channels or contact pads. Such undesired leakage can be avoided by providing a greater gap between the side walls of the pocket and the circuit die. In some embodiments, the gap 720 may be at least 3 times, at least 5 times, at least 7 times, at least 10 times, or at least 20 times greater than the required tolerance. In some embodiments, the gap 720 may be in a range, for example, from about 100 micrometers to about 2 mm or greater.

In some embodiments, after the formation of electrically conductive traces in the channels (e.g., the inlet channels 402i and 404i, the outlet channels 402o and 404o, or the inner channels 403 and 405 in FIG. 12), the void space in the gap 720 can be filled with an encapsulant material to protect the structure. The encapsulant material may include, for example, a dielectric material, a polymeric material, etc. In some embodiments, the encapsulant material can be delivered as a capillary liquid flow to fill the gaps. The liquid can also flow into the gaps, and can then be solidified to reinforce the deposition of the circuit die with the substrate and the contact interfaces therein.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

Listing of Exemplary Embodiments

It is to be understood that any one of embodiments 1-13, 14-21, 22-30 and 31-39 can be combined.
Embodiment 1 is an article comprising:
 a substrate having a major surface, wherein a pocket and one or more channels are formed on the major surface, and the channels each extend between a first end and a second end thereof, the first end being fluidly connected to the pocket;
 a solid circuit die disposed in the pocket, the solid circuit die having one or more contact pads on a surface thereof aligned with the first ends of the channels; and
 one or more electrically conductive traces formed in the one or more channels, the electrically conductive traces extending to the first ends of the channels and in direct contact with the contact pads of the solid circuit die.
Embodiment 2 is the article of embodiment 1, wherein the flexible polymeric substrate further comprises one or more reservoirs formed on the major surface thereof and connected to the second ends of the channels, the electrically conductive traces have a portion in the reservoirs and extend between the first and second ends of the channels.
Embodiment 3 is the article of embodiment 1 or 2, wherein the solid circuit die is attached, via an adhesive, to a bottom surface of the pocket.
Embodiment 4 is the article of any one of embodiments 1-3, wherein at least one of the electrically conductive traces is in direct contact with one contact pad on a side surface of the solid circuit die.
Embodiment 5 is the article of any one of embodiments 1-4, wherein at least one of the conductive traces extends onto an edge of an upper surface of the solid circuit die, and is in direct contact with an edge portion of one contact pad on an upper surface of the solid circuit die.
Embodiment 6 is the article of any one of embodiments 1-5, wherein the electrically conductive traces are formed by evaporating a conductive liquid.
Embodiment 7 is the article of any one of embodiments 1-6, wherein the solid circuit die and the pocket have a gap formed therebetween, the gap surrounding the periphery of the solid circuit die.
Embodiment 8 is the article of embodiment 7, wherein the gap is at least partially filled with an adhesive material.
Embodiment 9 is the article of embodiment 7, wherein a sealing structure is provided to separate the gap from the one or more channels.
Embodiment 10 is the article of any one of embodiments 1-9, wherein the one or more electrically conductive traces have a curved meniscus surface.
Embodiment 11 is the article of any one of embodiments 1-10, wherein the one or more electrically conductive traces are layered on a curved meniscus surface of an adhesive layer disposed in the one or more channels.
Embodiment 12 is the article of any one of embodiments 1-11, wherein the substrate is a flexible substrate including a web of indefinite length polymeric material.
Embodiment 13 is the article of any one of embodiments 1-12, the solid circuit die is a semiconductor die.
Embodiment 14 is a method comprising:
 providing a substrate having a major surface;
 forming a pocket and one or more channels on the major surface of the substrate, the channels each extending between a first end and a second end thereof, the first end being fluidly connected to the pocket;
 disposing a solid circuit die in the pocket, the solid circuit die having one or more contact pads on a surface thereof aligned with the first ends of the channels;
 disposing a conductive liquid at the second ends of the channels;
 flowing the conductive liquid, primarily by a capillary pressure, in the channels toward the first ends to make direct contact with the contact pads of the solid circuit die; and
 solidifying the conductive liquid to form one or more electrically conductive traces in direct contact with the contact pads of the solid circuit die.
Embodiment 15 is the method of embodiment 14 further comprising forming one or more reservoirs on the major surface thereof and in fluid communication with the second ends of the channels, wherein the conductive liquid is dispensed into the reservoirs.

Embodiment 16 is the method of embodiment 14 or 15, wherein the solid circuit die is attached, via an adhesive, to a bottom surface of the pocket.

Embodiment 17 is the method of any one of embodiments 14-16, wherein the conductive liquid flows toward and makes direct contact with one contact pad on a side surface of the solid circuit die.

Embodiment 18 is the method of any one of embodiments 14-17, wherein the conductive liquid flows toward and makes direct contact with an edge portion of one contact pad on an upper surface of the solid circuit die.

Embodiment 19 is the method of any one of embodiments 14-17 further comprising disposing an adhesive ink at the second ends of the channels, flowing the adhesive ink, primarily by a capillary pressure, in the channels toward the first ends to at least partially fill a gap between a side wall of the pocket and the solid circuit die.

Embodiment 20 is the method of embodiment 19 further comprising solidifying the adhesive ink to form an adhesive layer before forming the one or more electrically conductive traces thereon.

Embodiment 21 is the method of any one of embodiments 14-20, wherein the method is carried out on a roll-to-roll apparatus.

Embodiment 22 is a method of providing an electronic component having one or more contacts with interconnection, comprising:

providing a substrate having a registration feature shaped to receive the electronic component, and at least one channel shaped to extend away an area that corresponds with one of the contacts when the electronic component is disposed within the registration feature;

disposing the electronic component within the registration feature;

dispensing a conductive liquid within the channel such that the conductive liquid flows by capillary in the channel toward and wets the contacts; and solidifying the conductive liquid to form a conductive trace in the channel.

Embodiment 23 is the method according to embodiment 22 wherein the at least one channel further includes an enlarged portion shaped to provide a convenient receptacle for the dispensed conductive liquid.

Embodiment 24 is the method according to embodiment 22 or 23 wherein the registration feature includes an indentation defining a central portion shaped to receive the electronic component.

Embodiment 25 is the method according to embodiment 24, wherein the channel is shaped to extend away from the central portion such that that area where the channel enters the central portion corresponds with one of the contacts when the electronic component is disposed within the central portion.

Embodiment 26 is the method according to embodiment 24 or 25, wherein the depth of the central portion is such that the bottom of the electronic component within the central portion is positioned at the neutral bending plane of the substrate.

Embodiment 27 is the method according to any one of embodiments 22-26, wherein the electronic component is adhered to a bottom surface of the registration feature.

Embodiment 28 is the method according to embodiment 27, wherein the adhering is performed with a UV curable polyurethane compound.

Embodiment 29 is the method according to any one of embodiments 22-28, wherein the channel has a width approximately equal to the width of the contacts of the electronic component.

Embodiment 30 is the method according to any one of embodiments 22-29, wherein the channel further comprises an area on the substrate printed with a material preferentially wetted by the conductive liquid.

Embodiment 31 is the article or method of any one of the preceding embodiments, wherein at least one of the channels extends into the pocket with the first end inside the pocket and underneath the solid circuit die.

Embodiment 32 is the article or method of any one of the preceding embodiments, wherein the channels comprise an inlet channel and an outlet channel each extending into the pocket and having the respective first ends fluidly connected inside the pocket to form an inner channel, at least a portion of the inner channel being underneath the solid circuit die.

Embodiment 33 is the article or method of embodiment 32, wherein at least one of the contact pads is located on a bottom surface of the solid circuit die, facing the inner channel.

Embodiment 34 is the article or method of any one of the preceding embodiments, wherein the substrate further comprises one or more safety channels disposed adjacent to at least one of the channels, the safety channels each extend across a side wall of the pocket in a direction substantially parallel to the adjacent channel.

Embodiment 35 is the article or method of embodiment 34, wherein at least one of the safety channels extends to be underneath the solid circuit die.

Embodiment 36 is the article or method of any one of the preceding embodiments, wherein at least one of the pockets includes a sloped sidewall, and at least one of the channels extends across the sloped sidewall.

Embodiment 37 is the article or method of embodiment 36, wherein the slope side wall has an inclined angle in the range from about 30° to about 60°.

Embodiment 38 is the article or method of any one of the preceding embodiments, wherein the pocket is oversized such that there is a gap between edges of the pocket and the solid circuit die, the gap being at least 3 times greater than a required tolerance.

Embodiment 39 is the article or method of any one of the preceding embodiments, wherein the channels and the gap are backfilled with an encapsulate material.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about." Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. An article comprising:
a substrate having a major surface, wherein a pocket and one or more channels are formed on the major surface, and the channels each extend between a first end and a second end thereof, the first end being fluidly connected to the pocket;
a solid circuit die disposed in the pocket, the solid circuit die having one or more contact pads on a surface thereof aligned with the first ends of the channels; and
one or more electrically conductive traces formed in the one or more channels, the electrically conductive traces extending to the first ends of the channels and in direct contact with the contact pads of the solid circuit die,
wherein the one or more electrically conductive traces are layered on a curved meniscus surface of an adhesive layer disposed in the one or more channels.

2. The article of claim 1, wherein the substrate further comprises one or more reservoirs formed on the major surface thereof and connected to the second ends of the channels, the electrically conductive traces have a portion in the reservoirs and extend between the first and second ends of the channels.

3. The article of claim 1, wherein the solid circuit die is attached, via an adhesive, to a bottom surface of the pocket.

4. The article of claim 1, wherein at least one of the electrically conductive traces is in direct contact with one contact pad on a side surface of the solid circuit die.

5. The article of claim 1, wherein at least one of the conductive traces extends onto an edge of an upper surface of the solid circuit die, and is in direct contact with an edge portion of one contact pad on the upper surface of the solid circuit die.

6. The article of claim 1, wherein the electrically conductive traces are formed by solidifying a conductive liquid.

7. The article of claim 1, wherein the solid circuit die and the pocket have a gap formed therebetween, the gap surrounding the periphery of the solid circuit die.

8. The article of claim 7, wherein the gap is at least partially filled with an adhesive material.

9. The article of claim 7, wherein a sealing structure is provided to separate the gap from the one or more channels.

10. The article of claim 1, wherein the one or more electrically conductive traces have a curved meniscus surface.

11. The article of claim 1, wherein the substrate is a flexible substrate including a web of polymeric material.

12. The article of claim 1, wherein at least one of the channels extends into the pocket with the first end being underneath the solid circuit die.

13. The article of claim 1, wherein the substrate further comprises one or more safety channels disposed adjacent to at least one of the channels, the safety channels each extend across a side wall of the pocket in a direction substantially parallel to the adjacent channel.

14. The article of claim 13, wherein at least one of the safety channels extends to be underneath the solid circuit die.

15. The article of claim 1, wherein the pocket is oversized such that there is a gap between edges of the pocket and the solid circuit die, the gap being at least 3 times greater than a required tolerance.

16. The article of claim 15, wherein the channels and the gap are backfilled with an encapsulate material.

17. A method comprising:
providing a substrate having a major surface;
forming a pocket and one or more channels on the major surface of the substrate, the channels each extending between a first end and a second end thereof, the first end being fluidly connected to the pocket;
disposing a solid circuit die in the pocket, the solid circuit die having one or more contact pads on a surface thereof aligned with the first ends of the channels;
disposing an adhesive ink at the second ends of the channels, flowing the adhesive ink, primarily by a capillary pressure, in the channels toward the first ends to at least partially fill a gap between a side wall of the pocket and the solid circuit die;
disposing a conductive liquid at the second ends of the channels;
flowing the conductive liquid, primarily by a capillary pressure, in the channels toward the first ends to make direct contact with the contact pads of the solid circuit die; and
solidifying the conductive liquid to form one or more electrically conductive traces in direct contact with the contact pads of the solid circuit die.

18. The method of claim 17 further comprising forming one or more reservoirs on the major surface of the substrate and in fluid communication with the second ends of the channels, wherein the conductive liquid is dispensed into the reservoirs.

19. The method of claim 17, wherein the solid circuit die is attached, via an adhesive, to a bottom surface of the pocket.

20. The method of claim 17, wherein the conductive liquid flows toward and makes direct contact with one contact pad on a side surface of the solid circuit die.

21. The method of claim 17, wherein the conductive liquid flows toward and makes direct contact with an edge portion of one contact pad on an upper surface of the solid circuit die.

22. The method of claim 17 further comprising solidifying the adhesive ink to form an adhesive layer before forming the one or more electrically conductive traces thereon.

23. The method of claim 17, wherein the method is carried out on a roll-to-roll apparatus.

24. An article comprising:
a substrate having a major surface, wherein a pocket and one or more channels are formed on the major surface, and the channels each extend between a first end and a second end thereof, the first end being fluidly connected to the pocket;
a solid circuit die disposed in the pocket, the solid circuit die having one or more contact pads on a surface thereof aligned with the first ends of the channels; and
one or more electrically conductive traces formed in the one or more channels, the electrically conductive traces extending to the first ends of the channels and in direct contact with the contact pads of the solid circuit die, wherein the channels comprise an inlet channel and an outlet channel each extending into the pocket and having the respective first ends fluidly connected inside the pocket to form an inner channel, at least a portion of the inner channel being underneath the solid circuit die.

25. The article of claim 24, wherein at least one of the contact pads is located on a bottom surface of the solid circuit die, facing the inner channel.

26. An article comprising:
- a substrate having a major surface, wherein a pocket and one or more channels are formed on the major surface, and the channels each extend between a first end and a second end thereof, the first end being fluidly connected to the pocket;
- a solid circuit die disposed in the pocket, the solid circuit die having one or more contact pads on a surface thereof aligned with the first ends of the channels; and
- one or more electrically conductive traces formed in the one or more channels, the electrically conductive traces extending to the first ends of the channels and in direct contact with the contact pads of the solid circuit die,
- wherein at least one of the pockets includes a sloped sidewall, and at least one of the channels extends across the sloped sidewall.

* * * * *